(12) United States Patent
Kim

(10) Patent No.: US 9,680,504 B2
(45) Date of Patent: Jun. 13, 2017

(54) CONTROLLER, SEMICONDUCTOR MEMORY SYSTEM, DATA STORAGE SYSTEM AND OPERATING METHOD THEREOF

(71) Applicant: SK hynix Inc., Gyeonggi-do (KR)

(72) Inventor: Jae-Bum Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 133 days.

(21) Appl. No.: 14/634,182

(22) Filed: Feb. 27, 2015

(65) Prior Publication Data

US 2016/0112068 A1    Apr. 21, 2016

(30) Foreign Application Priority Data

Oct. 21, 2014  (KR) .................. 10-2014-0142355

(51) Int. Cl.
  *H03M 13/15*  (2006.01)
  *H03M 13/11*  (2006.01)
  *H03M 13/37*  (2006.01)

(52) U.S. Cl.
  CPC .... *H03M 13/1108* (2013.01); *H03M 13/1111* (2013.01); *H03M 13/3715* (2013.01)

(58) Field of Classification Search
  CPC .................................................. H03M 13/151
  USPC ........................................ 714/785, 780, 758
  See application file for complete search history.

(56) References Cited

U.S. PATENT DOCUMENTS

| | | | |
|---|---|---|---|
| 7,197,690 B2 | 3/2007 | Shen et al. | |
| 7,370,265 B2 | 5/2008 | Shen et al. | |
| 7,383,487 B2 | 6/2008 | Shen et al. | |
| 7,398,455 B2 | 7/2008 | Eroz et al. | |
| 8,051,355 B2 | 11/2011 | Taubin et al. | |
| 8,245,098 B2 | 8/2012 | Han et al. | |
| 8,312,354 B1* | 11/2012 | Varnica | H03M 13/1105 |
| | | | 714/780 |
| 8,406,048 B2 | 3/2013 | Yang et al. | |
| 8,464,129 B2 | 6/2013 | Gunnam | |
| 8,484,519 B2 | 7/2013 | Weathers et al. | |
| 8,644,067 B2 | 2/2014 | Jeon | |
| 8,719,663 B2 | 5/2014 | Li et al. | |
| 2013/0139035 A1 | 5/2013 | Zhong et al. | |
| 2014/0189461 A1* | 7/2014 | Cideciyan | H03M 13/2909 |
| | | | 714/758 |

(Continued)

FOREIGN PATENT DOCUMENTS

| KR | 1020060106041 | 10/2006 |
|---|---|---|
| KR | 1020110052530 | 5/2011 |

(Continued)

*Primary Examiner* — Fritz Alphonse

(74) *Attorney, Agent, or Firm* — IP & T Group LLP

(57) ABSTRACT

An operating method of a controller includes iterating a first ECC decoding on a codeword read from a semiconductor memory device according to a first read voltage a predetermined iteration number until the first ECC decoding succeeds, wherein a value of the first read voltage is updated on basis of a number of an unsatisfied syndrome check (USC); and when the first ECC decoding fails until the predetermined iteration number, performing a second ECC decoding on the codeword by generating soft decision data according to the first read voltage, a value of which corresponds to the minimum number of the USC among the updated values during the iterating of the first ECC decoding.

18 Claims, 19 Drawing Sheets

(56) References Cited

U.S. PATENT DOCUMENTS

2015/0178154 A1\* 6/2015 Kim .................... G06F 11/1048
714/758

FOREIGN PATENT DOCUMENTS

| KR | 1020120053122 | 5/2012 |
|----|---------------|--------|
| KR | 1020130006472 | 1/2013 |
| KR | 1020140047740 | 4/2014 |

\* cited by examiner

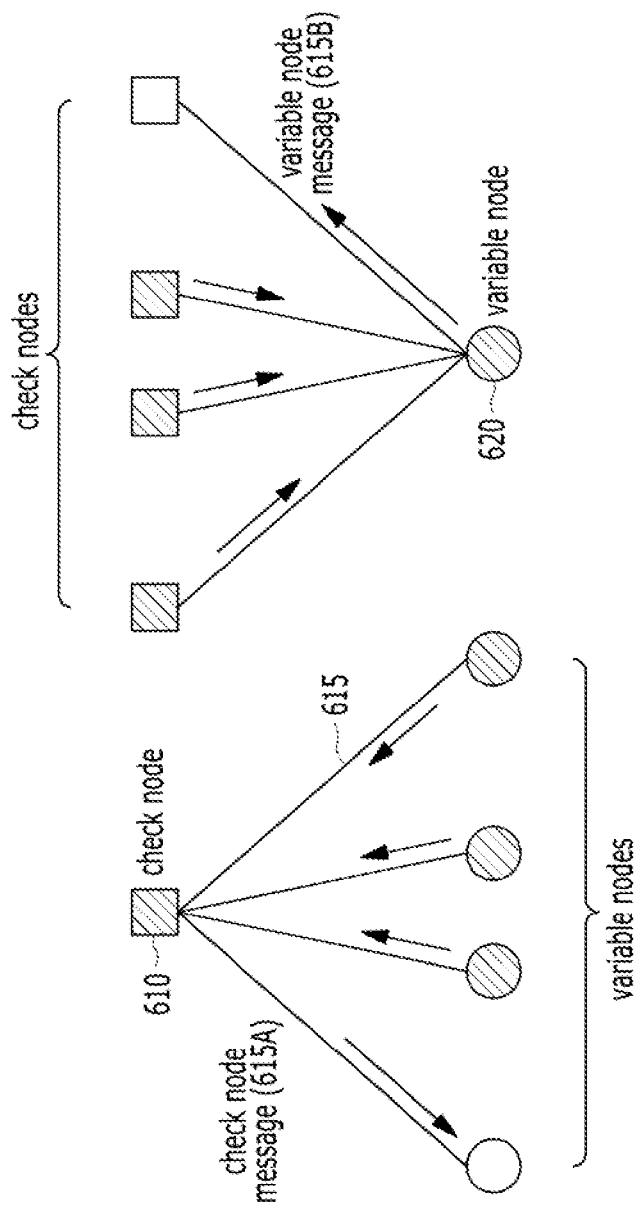

- After 1 iteration
$\underline{v} = (0 \quad 1 \quad 1 \quad 0 \quad 1 \quad 0 \quad 0 \quad 0 \quad 1 \quad 1)$ $$H\underline{v}^t = \begin{pmatrix} 1 & 1 & 1 & 1 & 0 & 0 & 0 & 0 & 0 & 0 \\ 1 & 0 & 0 & 0 & 1 & 1 & 1 & 0 & 0 & 0 \\ 0 & 1 & 0 & 0 & 1 & 0 & 0 & 1 & 1 & 0 \\ 0 & 0 & 1 & 0 & 0 & 1 & 0 & 1 & 0 & 1 \\ 0 & 0 & 0 & 1 & 0 & 0 & 1 & 0 & 1 & 1 \end{pmatrix} \begin{pmatrix} 0 \\ 1 \\ 1 \\ 0 \\ 1 \\ 0 \\ 0 \\ 0 \\ 1 \\ 1 \end{pmatrix} = \begin{pmatrix} 0 \\ 1 \\ 0 \\ 0 \\ 0 \end{pmatrix} \neq \underline{0}$$ → Perform next iteration Syndrome check

CONTROLLER, SEMICONDUCTOR MEMORY SYSTEM, DATA STORAGE SYSTEM AND OPERATING METHOD THEREOF

CROSS-REFERENCE TO RELATED APPLICATIONS

The present application claims priority of Korean Patent Application No. 10-2014-0142355, filed on Oct. 21, 2014, which is incorporated herein by reference in its entirety.

BACKGROUND

1. Field

Various exemplary embodiments of the present invention relate to a semiconductor design technology and, more particularly, to a controller, a semiconductor memory system, a data storage system and an operating method thereof.

2. Description of the Related Art

Semiconductor memory devices are generally classified into volatile memory devices, such as Dynamic Random Access Memory (DRAM) and Static RAM (SRAM), and nonvolatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetic RAM (MRAM), Resistive RAM (RRAM) and flash memory.

The volatile memory device loses data stored therein when power supply thereto is interrupted, whereas a nonvolatile memory device retains data stored therein even when power supply thereto is interrupted. In particular, a flash memory device is widely used as a storage medium in a computer system because of its high program speed, low power consumption and large data storage capacity.

In the nonvolatile memory device, especially in the flash memory device, data states storable in each memory cell are determined based on the number of bits stored in the memory cell. A memory cell storing 1-bit data per cell is called a single-bit cell or a single-level cell (SLC). A memory cell storing multi-bit data (i.e., 2 or more bits data) per cell is called a multi-bit cell, a multi-level cell (MLC) or a multi-state cell. The multi-bit cell is advantageous for high integration. However, as the number of bits programmed in each memory cell increase, the reliability decreases and the read failure rate increases.

For example, when k bits are to be programmed in a memory cell, one of $2^k$ threshold voltages is formed in the memory cell. Due to the minute differences between the electrical characteristics of memory cells, the threshold voltages of memory cells programmed with the same data form threshold voltage distribution. Threshold voltage distributions correspond to $2^k$ data values corresponding to k-bit information, respectively.

However, a voltage window available for threshold voltage distributions is limited. Therefore, as the value k increases, the distance between the threshold voltage distributions decreases and the adjacent threshold voltage distributions overlap each other. As the adjacent threshold voltage distributions overlap each other, read data may include several or several tens of error bits.

FIG. 1 is a threshold voltage distribution schematically illustrating program and erase states of a 3-bit multi-level cell (3-bit MLC) nonvolatile memory device.

FIG. 2 is a threshold voltage distribution schematically illustrating program and erase states due to characteristic deterioration of a 3-bit MLC nonvolatile memory device.

In an MLC nonvolatile memory device, e.g., an MLC flash memory device in which k-bit data is programmed in a memory cell, the memory cell may have one of $2^k$ threshold voltage distributions. For example, a 3-bit MLC has one of 8 threshold voltage distributions.

Threshold voltages of memory cells programmed with the same data form the threshold voltage distribution due to characteristic differences between memory cells. In a 3-bit MLC nonvolatile memory device, as illustrated in FIG. 1, threshold voltage distributions corresponding to 7 program states 'P1' to 'P7' and an erase state 'E' are formed. FIG. 1 shows an ideal case in which threshold voltage distributions do not overlap and have read voltage margins therebetween.

Referring to the flash memory example of FIG. 2, the memory cell may experience charge loss that electrons trapped at a floating gate or tunnel oxide film are discharged over time. Such charge loss may accelerate when the tunnel oxide film deteriorates by iterative program and erase operations. Charge loss results in a decrease in the threshold voltages of memory cells. For example, as illustrated in FIG. 2, the threshold voltage distribution may be shifted left due to charge loss.

Further, program disturbance, erase disturbance and/or back pattern dependency also cause increases in threshold voltages. As characteristics of memory cells deteriorate, as described above, threshold voltage distributions of adjacent states may overlap, as illustrated in FIG. 2.

Once threshold voltage distributions overlap, read data may include a significant number of errors when a particular read voltage is applied to a selected word line. For example, when a sensed state of a memory cell according to a read voltage Vread3 that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when threshold voltage distributions overlap, the memory cell, which actually has the third program state 'P3', may be erroneously determined to have the second program state 'P2'. In short, when the threshold voltage distributions overlap as illustrated in FIG. 2, read data may include a significant number of errors.

What is therefore required is a scheme for precisely determining optimal read voltages for data stored in memory cells of a semiconductor memory device.

SUMMARY

Various embodiments of the present invention are directed to a controller, a semiconductor memory system, a data storage system and an operating method thereof capable of precisely determining optimal read voltages for data stored in memory cells.

In accordance with an embodiment of the present invention, an operating method of a controller, comprising: iterating a first ECC decoding on a codeword read from a semiconductor memory device according to a first read voltage a predetermined iteration number until the first ECC decoding succeeds, wherein a value of the first read voltage is updated on basis of a number of an unsatisfied syndrome check (USC); and when the first ECC decoding fails until the predetermined iteration number, performing a second ECC decoding on the codeword by generating soft decision data according to the first read voltage, a value of which corresponds to the minimum number of the USC among the updated values during the iterating of the first ECC decoding.

The first ECC decoding may be a low density parity check (LDPC) decoding.

The USC may be a nonzero element of a vector generated by a syndrome check of the LDPC decoding.

The iterating of the first ECC decoding may include a first step of performing a first ECC decoding on a codeword read from a semiconductor memory device according to a first read voltage; a second step of determining the first ECC decoding to have failed or succeeded based on an unsatisfied syndrome check (USC) included in a result of the first ECC decoding; a third step of updating a value of the first read voltage based on a number of the USC when the first ECC decoding is determined to have failed; and a fourth step of iterating the first to third steps a predetermined iteration number until the first ECC decoding succeeds.

The second step may determine the number of the USC obtained as a result of the first step at each iteration of the first to third steps.

The third step may update the value of the first read voltage based on the number of the USC obtained as a result of the first step at each iteration of the first to third steps.

The third step may update the value of the first read voltage based on a predetermined relationship between the first read voltage and an average number of the USC.

The third step may update the value of the first read voltage based on equation 1, below.

The first read voltage to be updated=the first read voltage corresponding to a current iteration+ delta value ($\Delta$) [Equation 1]

The delta value ($\Delta$) may be determined based on equation 2, below.

$\Delta$=[USC_RDCNT]−[USC_RDCNT−1], where USC_RDCNT denotes the number of the USC corresponding to the current iteration, and [USC_RDCNT−1] denotes the number of the USC corresponding to the previous iteration. [Equation 2]

The delta value ($\Delta$) may be fixed.

The magnitude of the delta value ($\Delta$) may depend on the magnitude of equation 2.

Whether the delta value ($\Delta$) is a positive number or a negative number may depend on whether equation 2 represents a positive number or a negative number.

In accordance with an embodiment of the present invention, an operating method of a controller may include: a first step of performing a first ECC decoding on a codeword read from a semiconductor memory device according to a first read voltage; a second step of determining the first ECC decoding to have failed or succeeded based on an unsatisfied syndrome check (USC) included in a result of the first ECC decoding; a third step of updating a value of the first read voltage based on a number of the USC when the first ECC decoding is determined to have failed; and a fourth step of iterating the first to third steps a predetermined iteration number until the first ECC decoding succeeds.

The operating method of the controller may further include a fifth step of performing a second ECC decoding on the codeword by generating soft decision data according to the first read voltage, a value of which corresponds to the minimum number of the USC among the updated values during the fourth step, when the first ECC decoding fails until the predetermined iteration number.

The USC may be a nonzero element of a vector generated by a syndrome check of the LDPC decoding.

The second step may determine the number of the USC obtained as a result of the first step at each iteration of the first to third steps.

The third step may update the value of the first read voltage based on the number of the USC obtained as a result of the first step at each iteration of the first to third steps.

The third step may update the value of the first read voltage based on a predetermined relationship between the first read voltage and an average number of the USC.

The third step may update the value of the first read voltage based on following equation 1.

The first read voltage to be updated=the first read voltage corresponding to a current iteration+ delta value ($\Delta$) [Equation 1]

The delta value ($\Delta$) may be determined according to equation 2, below.

$\Delta$=[USC_RDCNT]−[USC_RDCNT−1], where USC_RDCNT denotes the number of the USC corresponding to the current iteration, and [USC_RDCNT−1] denotes the number of the USC corresponding to the previous iteration. [Equation 2]

The delta value ($\Delta$) may be fixed.

The magnitude of the delta value ($\Delta$) may depend on the magnitude of equation 2.

Whether the delta value ($\Delta$) is a positive number or a negative number may depend on whether equation 2 represents a positive number or a negative number.

In accordance with an embodiment of the present invention, a controller may comprise: means for iterating a first ECC decoding on a codeword read from a semiconductor memory device according to a first read voltage a predetermined iteration number until the first ECC decoding succeeds, wherein a value of the first read voltage is updated on basis of a number of an unsatisfied syndrome check (USC); and means for performing a second ECC decoding on the codeword by generating soft decision data according to the first read voltage, a value of which corresponds to the minimum number of the USC among the updated values during the iteration of the first ECC decoding, when the first ECC decoding fails until the predetermined iteration number.

The first ECC decoding may be a low density parity check (LDPC) decoding.

The USC may be a nonzero element of a vector generated by a syndrome check of the LDPC decoding.

The means for iterating the first ECC decoding may include first means for performing a first ECC decoding on a codeword read from a semiconductor memory device according to a first read voltage; second means for determining the first ECC decoding to have failed or succeeded on the basis of an unsatisfied syndrome check (USC) included in a result of the first ECC decoding; and third means for updating a value of the first read voltage based on a number of the USC when the first ECC decoding is determined to have failed. The controller may iterate the operations of the first to third means a predetermined iteration number until the first ECC decoding succeeds.

The second means may determine the number of the USC obtained by the first means at each iteration of the operations of the first to third means.

The third means may update the value of the first read voltage based on the number of the USC obtained by the first means at each iteration of the operations of the first to third means.

The third means may update the value of the first read voltage based on a predetermined relationship between the first read voltage and an average number of the USC.

The third means may update the value of the first read voltage based on following equation 1.

The first read voltage to be updated=the first read voltage corresponding to a current iteration+ delta value (Δ)     [Equation 1]

The delta value (Δ) may be determined according to following equation 2.

Δ=[USC_RDCNT]−[USC_RDCNT−1], where USC_RDCNT denotes the number of the USC corresponding to the current iteration, and [USC_RDCNT−1] denotes the number of the USC corresponding to the previous iteration.   [Equation 2]

The delta value (Δ) may be fixed.

The magnitude of the delta value (Δ) may depend on the magnitude of equation 2.

Whether the delta value (Δ) is a positive number or a negative number may depend on whether equation 2 represents a positive number or a negative number.

In accordance with an embodiment of the present invention, a controller may comprise: first means for performing a first ECC decoding on a codeword read from a semiconductor memory device according to a first read voltage; second means for determining the first ECC decoding to have failed or succeeded on the basis of an unsatisfied syndrome check (USC) included in a result of the first ECC decoding; and third means for updating a value of the first read voltage based on a number of the USC when the first ECC decoding is determined to have failed. The controller may iterate the operations of the first to third means a predetermined iteration number until the first ECC decoding succeeds.

The controller may further include fourth means for performing a second ECC decoding on the codeword by generating soft decision data according to the first read voltage, a value of which corresponds to the minimum number of the USC among the updated values during the iterating of the operations of the first to third means, when the first ECC decoding fails until the predetermined iteration number.

The first ECC decoding may be a low density parity check (LDPC) decoding.

The USC may be a nonzero element of a vector generated by a syndrome check of the LDPC decoding.

The second means may determine the number of the USC obtained by the first means at each iteration of the operations of the first to third means.

The third means may update the value of the first read voltage based on the number of the USC obtained by the first means at each iteration of the operations of the first to third means.

The third means may update the value of the first read voltage based on a predetermined relationship between the first read voltage and an average number of the USC.

The third means may update the value of the first read voltage based on following equation 1.

The first read voltage to be updated=the first read voltage corresponding to a current iteration+ delta value (Δ).     [Equation 1]

The delta value (Δ) may be determined according to following equation 2.

Δ=[USC_RDCNT]−[USC_RDCNT−1], where USC_RDCNT denotes the number of the USC corresponding to the current iteration, and [USC_RDCNT−1] denotes the number of the USC corresponding to the previous iteration.   [Equation 2]

The delta value (Δ) may be fixed.

The magnitude of the delta value (Δ) may depend on the magnitude of equation 2.

Whether the delta value (Δ) is a positive number or a negative number may depend on whether equation 2 represents a positive number or a negative number.

In accordance with an embodiment of the present invention, a semiconductor memory system may comprise: a semiconductor memory device and a controller. The controller may include: means for iterating a first ECC decoding on a codeword read from a semiconductor memory device according to a first read voltage a predetermined iteration number until the first ECC decoding succeeds, wherein a value of the first read voltage is updated on basis of a number of an unsatisfied syndrome check (USC); and means for performing a second ECC decoding on the codeword by generating soft decision data according to the first read voltage, a value of which corresponds to the minimum number of the USC among the updated values during the iterating of the first ECC decoding, when the first ECC decoding fails until the predetermined iteration number.

The first ECC decoding may be a low density parity check (LDPC) decoding.

The USC may be a nonzero element of a vector generated by a syndrome check of the LDPC decoding.

The means for iterating the first ECC decoding may include first means for performing a first ECC decoding on a codeword read from a semiconductor memory device according to a first read voltage; second means for determining the first ECC decoding to have failed or succeeded on the basis of an unsatisfied syndrome check (USC) included in a result of the first ECC decoding; and third means for updating a value of the first read voltage based on a number of the USC when the first ECC decoding is determined to have failed. The controller may iterate the operations of the first to third means a predetermined iteration number until the first ECC decoding succeeds.

The second means may determine the number of the USC obtained by the first means at each iteration of the operations of the first to third means.

The third means may update the value of the first read voltage based on the number of the USC obtained by the first means at each iteration of the operations of the first to third means.

The third means may update the value of the first read voltage based on a predetermined relationship between the first read voltage and an average number of the USC.

The third means may update the value of the first read voltage based on equation 1, below.

The first read voltage to be updated=the first read voltage corresponding to a current iteration+ delta value (Δ).     [Equation 1]

The delta value (Δ) may be determined according to equation 2, below.

Δ=[USC_RDCNT]−[USC_RDCNT−1], where USC_RDCNT denotes the number of the USC corresponding to the current iteration, and [USC_RDCNT−1] denotes the number of the USC corresponding to the previous iteration.   [Equation 2]

The delta value (Δ) may be fixed.

The magnitude of the delta value (Δ) may depend on the magnitude of equation 2.

Whether the delta value (Δ) is a positive number or a negative number may depend on whether equation 2 represents a positive number or a negative number.

In accordance with an embodiment of the present invention, a semiconductor memory system may comprise: a semiconductor memory device and a controller. The controller may comprise: first means for performing a first ECC decoding on a codeword read from a semiconductor memory device according to a first read voltage; second means for determining the first ECC decoding to have failed or succeeded on the basis of an unsatisfied syndrome check (USC) included in a result of the first ECC decoding; and for updating a value of the first read voltage based on a number of the USC when the first ECC decoding is determined to have failed. The controller may iterate the operations of the first to third means a predetermined iteration number until the first ECC decoding succeeds.

The controller may further include fourth means for performing a second ECC decoding on the codeword by generating soft decision data according to the first read voltage, a value of which corresponds to the minimum number of the USC among the updated values during the iterating of the operations of the first to third means, when the first ECC decoding fails until the predetermined iteration number.

The first ECC decoding may be a low density parity check (LDPC) decoding.

The USC may be a nonzero element of a vector generated by a syndrome check of the LDPC decoding.

The second means may determine the number of the USC obtained by the first means at each iteration of the operations of the first to third means.

The third means may update the value of the first read voltage based on the number of the USC obtained by the first means at each iteration of the operations of the first to third means.

The third means may update the value of the first read voltage based on a predetermined relationship between the first read voltage and an average number of the USC.

The third means may update the value of the first read voltage based on equation 1, below.

The first read voltage to be updated=the first read voltage corresponding to a current iteration+ delta value (Δ). [Equation 1]

The delta value (Δ) may be determined according to equation 2, below.

Δ=[USC_RDCNT]−[USC_RDCNT−1], where USC_RDCNT denotes the number of the USC corresponding to the current iteration, and [USC_RDCNT−1] denotes the number of the USC corresponding to the previous iteration. [Equation 2]

The delta value (Δ) may be fixed.

The magnitude of the delta value (Δ) may depend on the magnitude of equation 2.

Whether the delta value (Δ) is a positive number or a negative number may depend on whether equation 2 represents a positive number or a negative number.

In accordance with various embodiments of the present invention, an optimal read voltage for data stored in memory cell of a semiconductor memory device may be effectively determined.

BRIEF DESCRIPTION OF THE DRAWINGS

FIG. 6A is a schematic diagram illustrating LDPC decoding expressed by a tanner graph.

DETAILED DESCRIPTION

Figure 1:
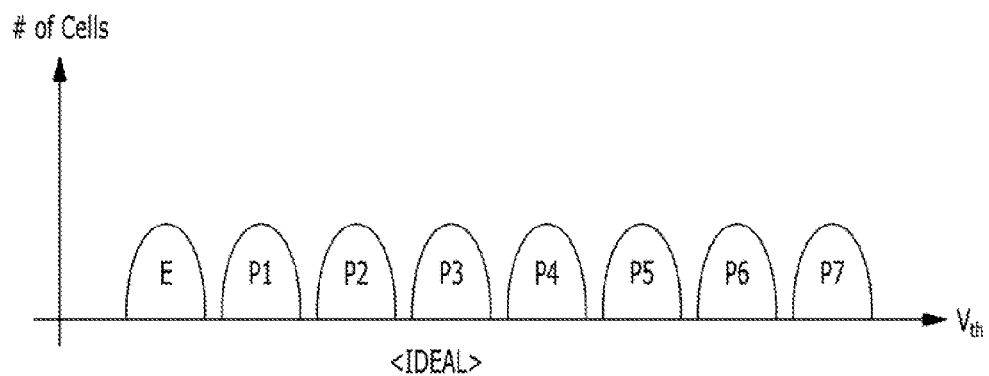
FIG. 1 is a threshold voltage distribution schematically illustrating program and erase states of a 3-bit multi-level cell (3-bit MLC) nonvolatile memory device.
Figure 2:
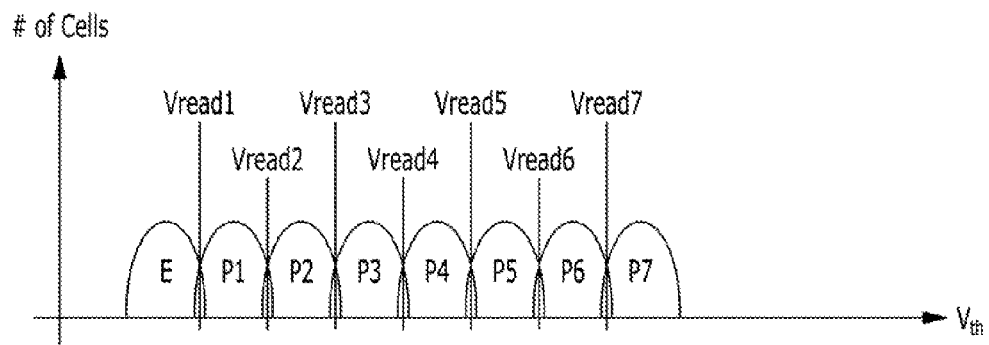
FIG. 2 is a threshold voltage distribution schematically illustrating program and erase states due to characteristic deterioration of a 3-bit MLC nonvolatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on"

means not only "directly on" but also "on" something with an intermediate feature(s) or a layer(s) therebetween, and that "over" means not only directly on top but also on top of something with an intermediate feature(s) or layer(s) therebetween. When a first layer is referred to as being "on" a second layer or "on" a substrate, it not only refers to a case where the first layer is formed directly on the second layer or the substrate, but also a case where a third layer exists between the first layer and the second layer or the substrate.

Figure 3:
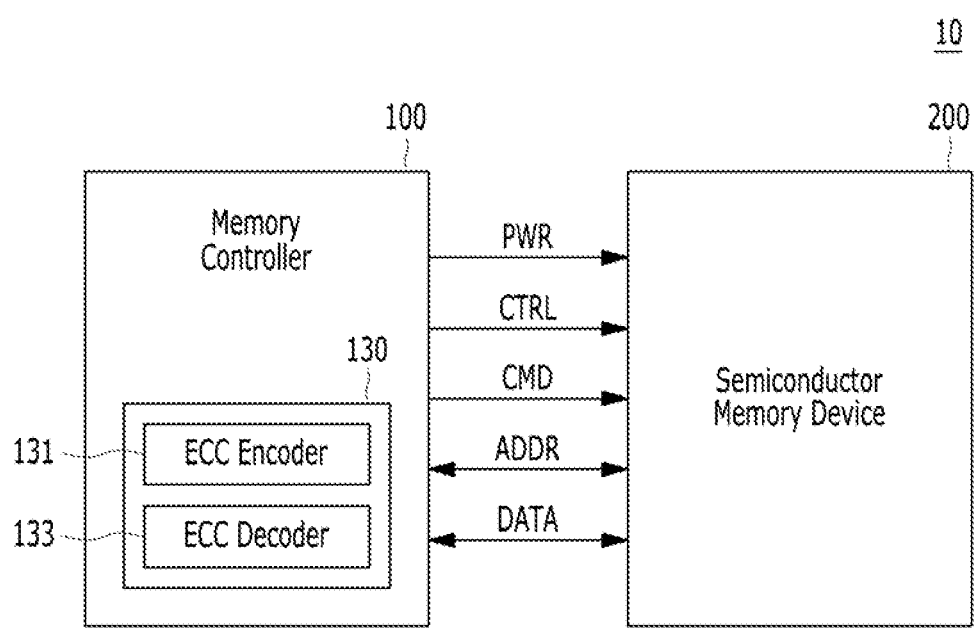
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4:
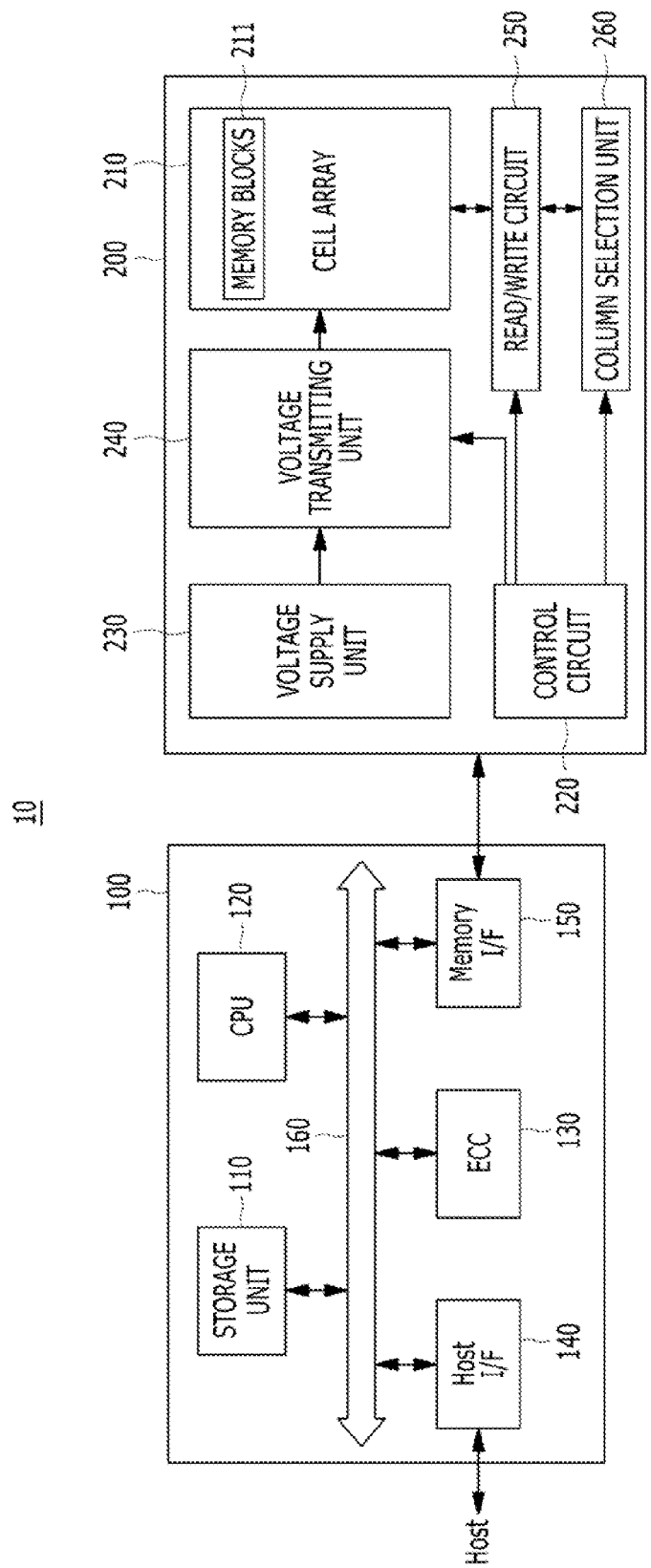
FIG. 4 is a detailed block diagram illustrating a semiconductor memory system shown in FIG. 3.

FIG. 4 is a detailed block diagram illustrating the semiconductor memory system 10 shown in FIG. 3.

Figure 5:
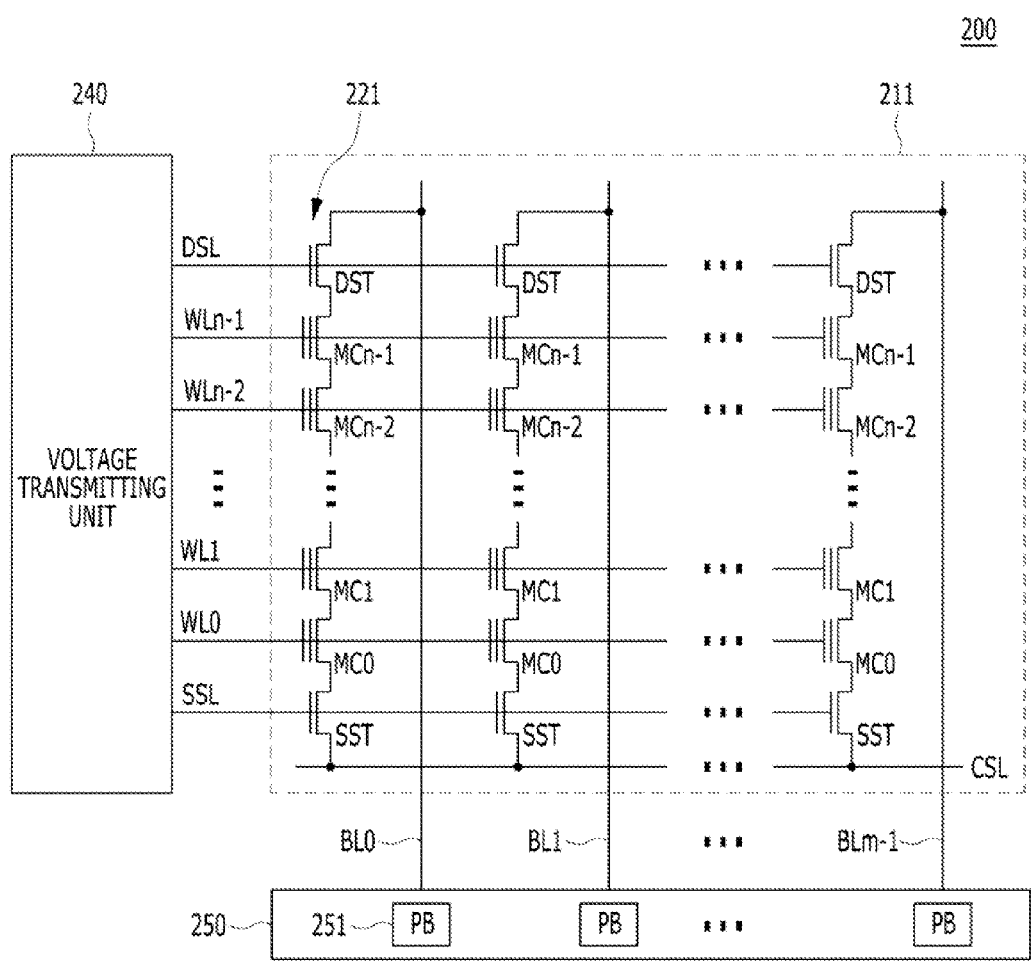
FIG. 5 is a circuit diagram illustrating a memory block shown in FIG. 3.

FIG. 5 is a circuit diagram illustrating a memory block 211 shown in FIG. 3.

Referring FIGS. 3 and 5, the semiconductor memory system 10 may include a semiconductor memory device 200 and a memory controller 100.

The semiconductor memory device 200 may perform one or more erase, program, and read operations under the control of the memory controller 100. The semiconductor memory device 200 may receive a command CMD, an address ADDR and data DATA through Input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 131 and an ECC decoder 133.

The ECC encoder 131 may perform error correction encoding on data to be programmed into the semiconductor memory device 200 to output data to which parity bits are added. The parity bits may be stored in the semiconductor memory device 200.

The ECC decoder 133 may perform error correction decoding on data read from the semiconductor memory device 200. The ECC decoder 133 may determine whether the error correction decoding is successful, and may output an instruction signal based on the determination result. The ECC decoder 133 may correct error bits of data using parity bits generated at the ECC encoding.

When the number of error bits exceeds error correction capacity of the ECC unit 130, the ECC unit 130 may not correct the error bits. In this case, the ECC unit 130 may generate an error correction fall signal.

The ECC unit 130 may correct an error through a coded modulation such as a low-density parity-check (LDPC) code, a Bose-Chaudhuri-Hocquenghem (BCH) code, a turbo code, a Reed-Solomon (RS) code, a convolution code, a Recursive Systematic Code (RSC), a Trellis-Coded Modulation (TCM), a Block Coded Modulation (BCM), and so on. The ECC unit 130 may include all circuits, systems, or devices for error correction.

As described above, when the number of error bits exceeds error correction capacity of the ECC unit 130, the ECC unit 130 may generate the error correction fail signal. In accordance with an embodiment of the present invention, the ECC unit 130 may perform an error bit correcting operation using hard decision read data and soft decision data.

The controller 100 and the semiconductor memory device 200 may be integrated in a single semiconductor device. For example, the controller 100 and the semiconductor memory device 200 may be integrated in a single semiconductor device such as a solid-state drive (SSD). The solid state drive may include a storage device for storing data in a semiconductor memory. When the semiconductor memory system 10 is used in an SSD, operation speed of a host (not shown) coupled to the semiconductor memory system may be remarkably improved.

The controller 100 and the semiconductor memory device 200 may be integrated in a single semiconductor device such as a memory card. For example, the controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4, the memory controller 100 may include a storage unit 110, a CPU 120, the ECC unit 130, a host interface 140, a memory interface 150, and a system bus 160. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct an error included in the data read from the semiconductor memory device 200. The memory interface 150 may interface with the semiconductor memory device 200. The CPU 120 may perform general various control operations.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 5, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

FIG. 5 exemplarily illustrates a memory block 211 comprising a NAND-type flash memory cell. However, the memory block 211 of the memory device 200 will not be limited to the NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a plurality of variable read voltages for generating a plurality of read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to selected word lines or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside, for example, the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

FIG. 6A is a schematic diagram illustrating LDPC decoding expressed by a tanner graph.

FIG. 68B is a schematic diagram illustrating an LDPC code.

Figures 6B, 6C:
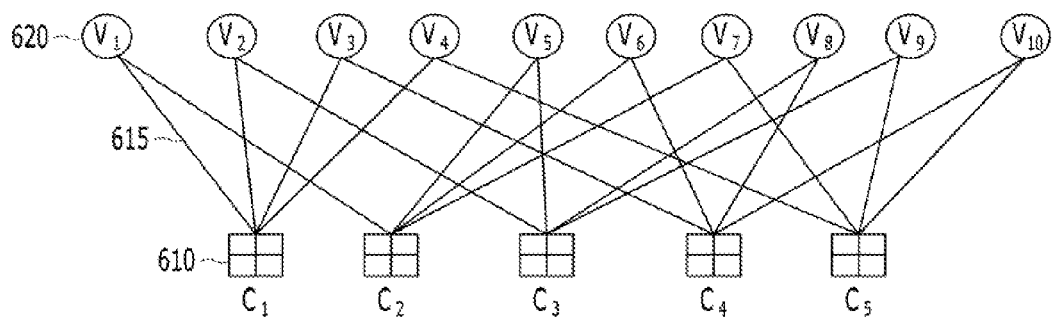
FIG. 6B is a schematic diagram illustrating an LDPC code.
FIG. 6C is a schematic diagram illustrating a syndrome check process according to LDPC decoding.

FIG. 6C is a schematic diagram illustrating a syndrome check process according to the LDPC decoding.

An Error Correction Code (ECC) is commonly used in storage systems. Various physical phenomena occurring in storage devices result in noise effects that corrupt the stored information. Error correction coding schemes can be used for protecting the stored information against the resulting errors. This is done by encoding the information before storing the information in the memory device. The encoding process transforms the information bit sequence into a codeword by adding redundancy to the information. This redundancy can then be used in order to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a tanner graph describing interconnections between the constituent codes. In this case, decoding can be viewed as an iterative message passing over the graph edges.

The iterative codes may include a low-density parity-check (LDPC) code. The LDPC code is a linear binary block code defined by a sparse parity-check matrix H.

Referring to FIG. 6A, the LDPC code has a parity check matrix in which the number of 1s in each row and column is very small, and its structure can be defined by the tanner graph including check nodes 610, variable nodes 620, and edges 615 for connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

A decoding process of the LDPC code is performed by iterative decoding based on a 'sum-product' algorithm. A decoding method can be provided based on a suboptimal message-passing algorithm such as a 'min-sum' algorithm, which is a simplified version of the sum-product algorithm.

For example, referring to FIG. 6B, the tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 200 coupled to each of the variable nodes 620 is fixed at 2.

FIG. 6C shows a parity check matrix H corresponding to the tanner graph. The parity check matrix H is similar to the graphic expression of the parity check equations. In the parity check matrix H, the same number of 1s in each column and each row is included. That is, each column of the parity check matrix H has two 1s corresponding to the connections between each of the variable nodes 620 and the check nodes 610, and each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the tanner graph. In this case, each node updates the messages based on the sum-product algorithm or a similar suboptimal algorithm.

The LDPC decoding on a codeword having a predetermined length, which is read from the memory cell of the memory block 211 according to a first hard decision read voltage, may comprise a plurality of iterations, each of which includes update of the check nodes 610 after an initial update of the variable nodes 620, update of the variable nodes 620, and a syndrome check. After the single iteration, when the result of the syndrome check satisfies a predetermined condition, the LDPC decoding may end. When the result of the syndrome check does not satisfy the predetermined condition, another single iteration may be performed on the memory cell of the memory block 211 with a second hard decision read voltage that is different from the first hard decision read voltage. The number of iterations may be limited to a maximum read count. When the result of the syndrome check does not satisfy the predetermined condition until the number of iterations reaches the maximum read count, the LDPC decoding on the codeword may be determined to have failed in ECC decoding.

Referring to FIG. 6C, the syndrome check is a process of identifying whether the product result $Hv^t$ of the parity check matrix H and a vector "v", which is obtained by the update of the variable nodes 620, satisfies the predetermined condition. When the product result $Hv^t$ of the parity check matrix H and the vector "v" becomes the zero vector, the product result $Hv^t$ may be evaluated to satisfy the predetermined condition.

FIG. 6C shows the syndrome check process. FIG. 6C exemplarily shows a non-zero vector "01000" as the product result $Hv^t$, and thus FIG. 6C shows that the syndrome check does not satisfy the predetermined condition and another single iteration should be performed with another hard decision read voltage.

Considering the non-zero vector "01000" as the product result $Hv^t$, the number of non-zero vector elements or elements, which do not meet the zero vector condition, is 1. In the description, the elements that do not meet the zero vector condition of the syndrome check for the product result $Hv^t$ in the single iteration is defined as unsatisfied syndrome check (USC). FIG. 6C shows the result of the syndrome check where the number of the USC is 1.

Figure 7A:
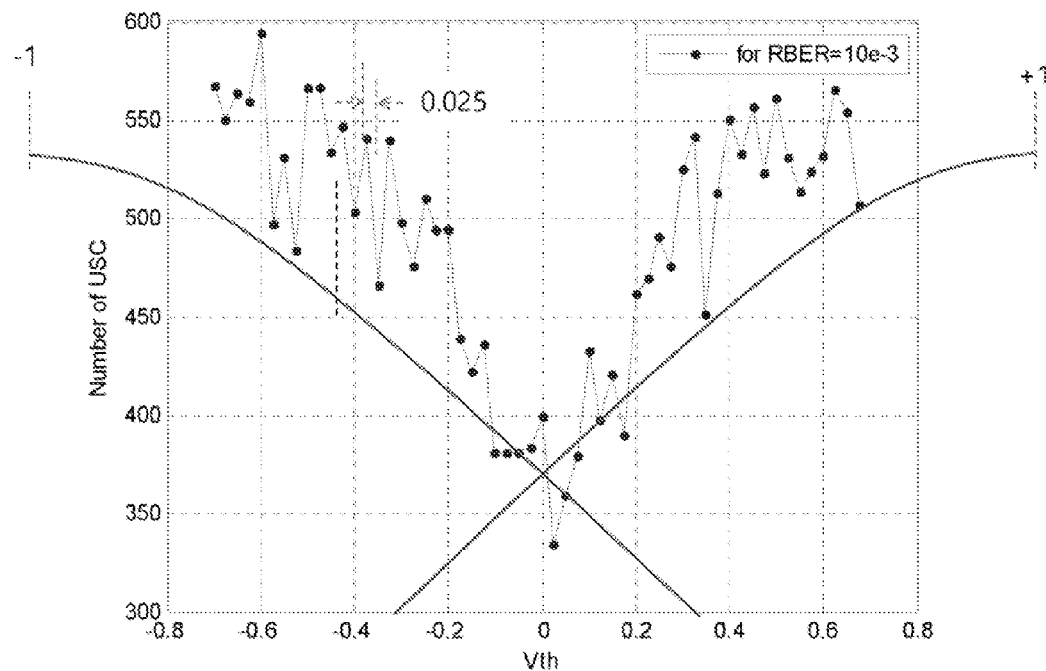
FIG. 7A is a graph illustrating transition of a number of USC as a hard decision read voltage changes.

FIG. 7A is a graph illustrating transition of the number of USC as a hard decision read voltage changes.

Figure 7B:
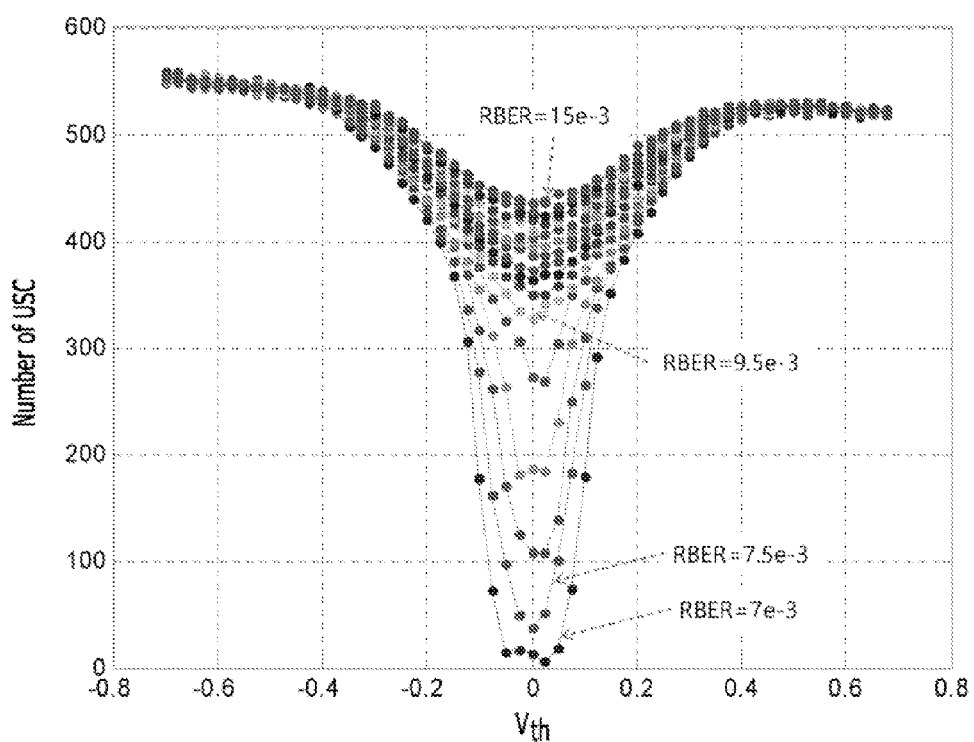
FIG. 7B is a graph illustrating transition of a number of USC according to RBER as a hard decision read voltage changes.

FIG. 7B is a graph illustrating transition of the number of USC according to a raw bit error rate (RBER) as the hard decision read voltage changes.

FIG. 7A shows threshold voltage distribution of memory cells of a NAND flash memory device, which is the Gaussian distribution. FIG. 7A also shows a relation between the number of the USC and the hard decision read voltages Vth, which are measured in units of 0.025 when the RBER is 10e-3 and the length of ECC target codeword is 18342. In the given threshold voltage distribution, the optimal read voltage Vopt is "0" at a point where the hard decision read voltages Vth is "0" (Vth=0) and the number of the USC is minimized around the optimal read voltage Vopt (Vth=0).

FIG. 7B shows relations between the number of the USC and the hard decision read voltages Vth of the memory cells of the NAND flash memory device according to various RBER. In spite of the various RBER, the number of the USC is minimized around the optimal read voltage Vopt at a point where the hard decision read voltages Vth is "0" (Vth=0).

Therefore, although it cannot be definitely shown that there is direct correlation between the number of the USC and occurrence rate of errors in the codeword, it does show that there is considerable correlation between the number of the USC and occurrence rate of errors in the codeword. Therefore, the number of the USC may represent the quality of the codeword.

As described above, the ECC unit 130 may detect and correct errors included in the read data from the semiconductor memory device 200 in order to recover error-free information bit sequences from the codeword read from the memory cell of the memory block 211 according to the optimal read voltage Vopt.

For example, when the LDPC decoding on the codeword read according to the first hard decision read voltage is determined to have failed in the ECC decoding, since the syndrome check does not satisfy the zero vector condition as the result of the single iteration, the ECC unit 130 may perform another single iteration of the LDPC decoding with the second hard decision read voltage that is different from the first hard decision read voltage. That is, the ECC unit 130 may read the codeword from the memory cell according to the second hard decision read voltage different from the first hard decision read voltage, and may perform another single iteration of the LDPC decoding to the codeword read according to the second hard decision read voltage.

Efficiency of the retry or the iteration may depend on how the second hard decision read voltage for the retry is determined. That is, when the optimal read voltage Vopt is determined with the minimum retries, the information bit sequence may be recovered from the codeword with the minimum retries.

In accordance with an embodiment of the present invention, for the minimum retries, the USC may be used to determine the optimal read voltage Vopt.

In accordance with an embodiment of the present invention, it is possible to determine the change in direction and the value of the hard decision read voltage Vth for the retry and thus to determine the optimal read voltage Vopt with the minimum retries based on the relationship between the number of the USC and the hard decision read voltages Vth of the memory cells of the NAND flash memory device shown in FIGS. 7A and 7B when analysing the gradient of the number of the USC for the codeword read from the memory cell of the memory block 211 according to the current and previous hard decision read voltages in the current and previous iterations.

Further, in accordance with an embodiment of the present invention, it is possible to determine the optimal read voltage Vopt with the minimum retries through ECC decoding with soft decision data generated according to the hard decision read voltage Vth corresponding to the minimum number of the USC based on the relationship between the number of the USC and the hard decision read voltages Vth of the memory cells of the NAND flash memory device shown in FIGS. 7A and 7B even though the LDPC decoding on the codeword according to the hard decision read voltage Vth is determined to have failed since the syndrome check does not satisfy the zero vector condition until the iteration number of the LDPC decoding reaches the maximum read count.

Figure 8:
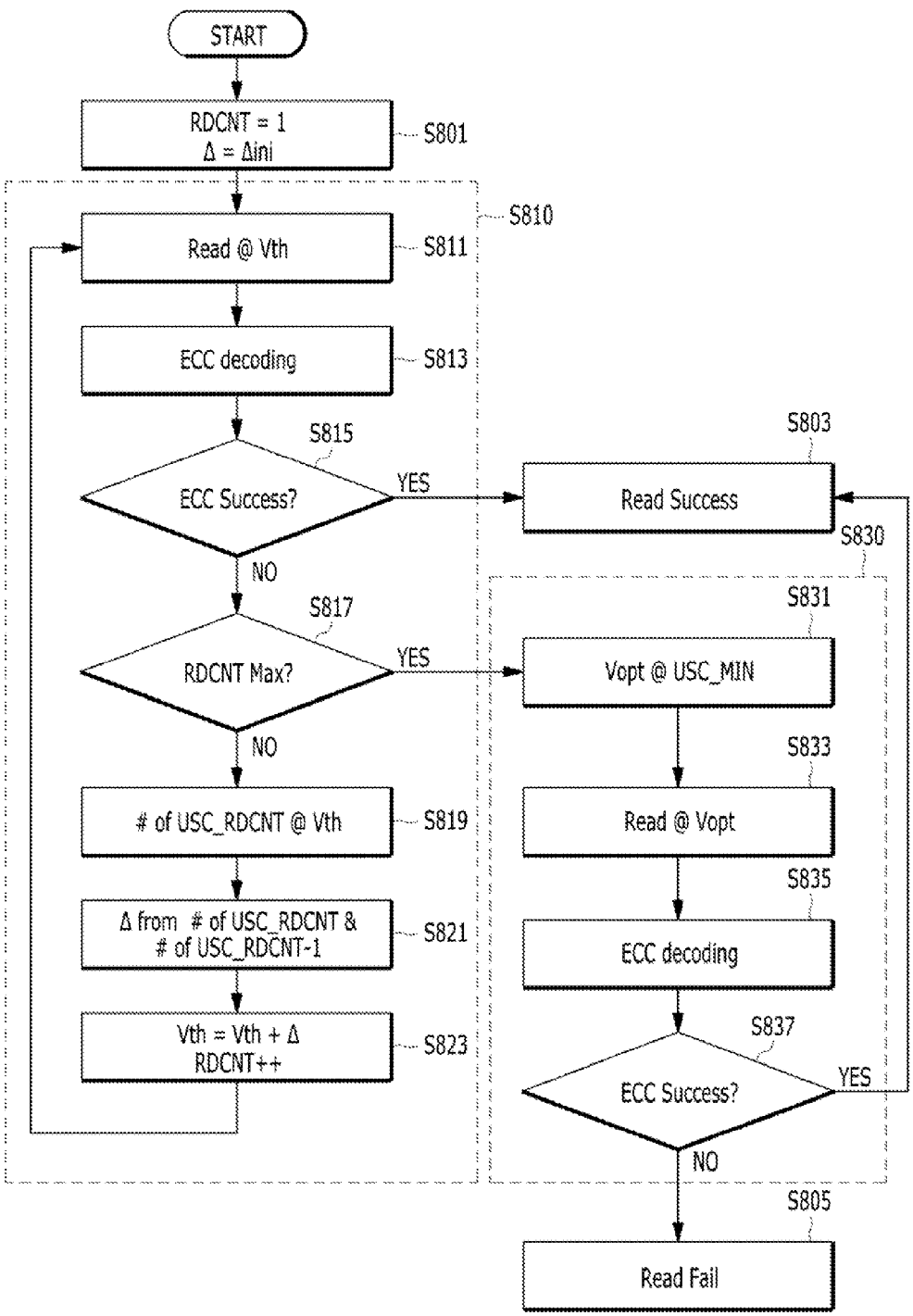
FIG. 8 is a flow chart illustrating an operation of a controller shown in FIG. 3.

FIG. 8 is a flow chart illustrating an operation of the controller 100.

Referring to FIG. 8, the operation of the controller 100 may include step S810 of hard decision ECC decoding, and may further include step S830 of soft decision ECC decoding.

As described with reference to FIGS. 6A to 7B, step S810 of the hard decision ECC decoding may repeat ECC decoding such as the LDPC decoding on the codeword read from the memory cell of the memory block 211 according to the plurality of hard decision read voltages, which are determined on the basis of the USC.

For example, when the LDPC decoding on the codeword read from the memory cell of the memory block 211 according to the first hard decision read voltage may be determined to have failed in the ECC decoding because the syndrome check does not satisfy the zero vector condition as the result of the single iteration, the controller 100 may retry another single iteration of the LDPC decoding with the second hard decision read voltage different from the first hard decision read voltage. In accordance with an embodiment of the present invention, for the minimum retries, the USC may be used to determine the hard decision read voltage.

Step S830 of the soft decision ECC decoding may perform ECC decoding when the LDPC decoding on the codeword according to the hard decision read voltage is determined to have failed in satisfying the zero vector condition of the syndrome check even until the iteration number of the LDPC decoding reaches the maximum read count during step S810 of the hard decision ECC decoding. Step S830 of the soft decision ECC decoding may perform ECC decoding by generating the soft decision data according to the optimal read voltage Vopt corresponding to the minimum number of the USC among the numbers of the USC obtained in the course of performing the iterations until the maximum read count during step S810 of the hard decision ECC decoding.

Referring to FIG. 8, the operation of the controller 100 may start with step S801 of initializing a variable RDCNT and a delta value Δ, i.e., RDCNT=1 and Δ=Δini. The variable RDCNT may be used to determine whether the iteration of the LDPC decoding is performed until the maximum read count. The delta value Δ may be used to determine the hard decision read voltage for the retry.

Then, during step S810 of the hard decision ECC decoding, at step S811, the controller 100 may read a codeword of predetermined length from a memory cell of the memory block 211 according to a predetermined first hard decision read voltage, which is generated by the voltage supply unit 230. At step S813, the controller 100 may perform ECC decoding such as the LDPC decoding, which is described with reference to FIGS. 6A to 7B, for the codeword read at step S811. In detail, as described with reference to FIGS. 6A to 7B, after the initial update of the variable nodes 620, the controller 100 may update the check nodes 610 and the variable nodes 620.

Then, at step S815, the controller 100 may determine whether the ECC decoding at step S813 succeeds based on the result of the ECC decoding at step S813. For example, the controller 100 may identify whether the product result $Hv^t$ of the parity check matrix H and a vector "v", which is obtained by the update of the variable nodes 620 as the result of the ECC decoding of step S813, is the zero vector.

As described with reference to FIGS. 6A to 7B, when the product result $Hv^t$ is the zero vector as determined at step S815, the ECC decoding of step S813 may be determined to have succeeded at step S803.

On the other hand, when the product result $Hv^t$ is not the zero vector, for example "01000" as shown in FIG. 6C, as determined at step S815, the ECC decoding of step S813 may be determined to have failed.

Steps S813 and S815 may form the single iteration described with reference to FIGS. 6A to 7B.

When it has been determined that the ECC decoding of step S813 has failed at step S815, the controller 100 may determine whether the read count number of the codeword from the memory cell of the memory block 211, i.e., the iteration number of the LDPC decoding, reaches the maximum read count at step S817. The controller 100 may perform step S817 by determining whether a value of the variable RDCNT reaches a predetermined maximum value.

When the controller 100 determines that the value of the variable RDCNT reaches the maximum read count at step S817, step S830 of the soft decision ECC decoding may be additionally performed since the hard decision ECC decoding fails despite of the maximum read count of the iterations.

Otherwise, when the controller 100 determines that the value of the variable RDCNT does not yet reach the maximum read count at step S817, the iteration number of the LDPC decoding may not reach the maximum read count. Therefore, the controller 100 may retry the iteration of the LDPC decoding on the codeword read from the memory cell of the memory block 211 according to a second hard decision read voltage, which is different from the first hard decision read voltage. Meanwhile, the controller 100 may store the number of the USC, which is identified at step S815, in the course of the iteration of the LDPC decoding.

In detail, at step S819, the controller 100 may store the number of the USC corresponding to the first hard decision read voltage or the number of the USC identified at step S815. For example, referring to FIG. 6C, the number of the USC included in the nonzero vector "01000" is 1. At step S819, the controller 100 may store the number of the USC (USC_RDCNT) corresponding to the current iteration or the number of the USC (USC_RDCNT) corresponding to the first hard decision read voltage.

As illustrated in FIGS. 7A and 7B, the number of the USC may be substantially probed value at the first hard decision read voltage, or may be the average value at the first hard decision read voltage. The average number of the USC may be obtained from a pre-stored relationship table between the hard decision read voltages and the average numbers of the USC, for example a table representing relationships between the hard decision read voltages and the average numbers of the USC illustrated in FIGS. 7A and 7B.

The number of the USC may be stored in one or more of the memory cell array 210 and the storage unit 110.

Then, at step S821, the controller 100 may determine the delta value Δ for determination of the second hard decision read voltage in order to retry the iteration. The delta value Δ may be determined based on the following equation 1.

$$\Delta = [\text{USC\_RDCNT}] - [\text{USC\_RDCNT}-1], \text{ where}$$
[USC_RDCNT] denotes the number of the USC corresponding to the current iteration, and
[USC_RDCNT-1] denotes the number of the USC corresponding to the previous iteration.  [Equation 1]

During the initial iteration, the delta value Δ may be the initial value Δini set at step S801.

For example, the delta value Δ may be fixed, in which case the iterations may be retried according to the hard decision read voltages of a fixed interval corresponding to the fixed delta value Δ.

Also, for example, the magnitude of the delta value Δ may depend on the magnitude of equation 1. For example, the magnitude of the delta value Δ may become greater as the magnitude of equation 1 becomes greater. For example, the magnitude of the delta value Δ may become smaller as the magnitude of equation 1 becomes smaller. In a contrasting example, the magnitude of the delta value Δ may become smaller as the magnitude of equation 1 becomes greater. For example, the magnitude of the delta value Δ may become greater as the magnitude of equation 1 becomes smaller.

The magnitude relationship between equation 1 and the delta value Δ may be obtained from the pre-stored relationship table between the hard decision read voltages and the average numbers of the USC, for example, the table representing relationship between the hard decision read voltages and the average numbers of the USC illustrated in FIGS. 7A and 7B.

In such case, the interval between the hard decision read voltages for the iteration retry may be relatively small in the section where the average numbers of the USC drastically change while the interval between the hard decision read voltages for the iteration retry may be relatively great in the section where the average numbers of the USC moderately change, as can be seen from FIGS. 7A and 7B illustrating the relationship between the hard decision read voltages and the average numbers of the USC.

At step S821, the controller 100 may determine whether the delta value Δ is positive or negative or whether the second hard decision read voltage for the iteration retry is to be greater or smaller than the first hard decision read voltage based on whether equation 1 represents a positive number or a negative number.

For example, referring to FIGS. 7A and 7B, when equation 1 represents a positive number, which means that the number of the USC (USC_RDCNT) corresponding to the current iteration is greater than the number of the USC (USC_RDCNT-1) corresponding to the previous iteration, or means that the number of the USC becomes greater as the hard decision read voltage changes, the first hard decision read voltage is greater than the optimal read voltage Vopt. In such case, the delta value Δ may be set negative. Then, the second hard decision read voltage for the iteration retry may be set smaller than the first hard decision read voltage.

For example, referring to FIGS. 7A and 7B, when equation 1 represents a negative number, which means that the number of the USC (USC_RDCNT) corresponding to the current iteration is smaller than the number of the USC (USC_RDCNT-1) corresponding to the previous iteration, or means that the number of the USC becomes smaller as the hard decision read voltage changes, the first hard decision read voltage is smaller than the optimal read voltage Vopt. In such case, the delta value Δ may be set positive. Then, the second hard decision read voltage for the iteration retry may be set greater than the first hard decision read voltage.

Then, at step S823, the controller 100 may set the second hard decision read voltage for the iteration retry based on the first hard decision read voltage and the delta value Δ set at step S821. The controller 100 may perform step S821 by summing the first hard decision read voltage and the delta value Δ set at step S821.

Referring to FIGS. 7A and 7B, as described above, when the delta value Δ is set negative at step S821, the second hard decision read voltage may be set smaller than the first hard decision read voltage at step S823. The second hard decision read voltage according to the negative delta value Δ may be between the optimal read voltage Vopt and the first hard decision read voltage, which is greater than the optimal read voltage Vopt. On the other hand, when the delta value Δ is set positive at step S821, the second hard decision read voltage may be set greater than the first hard decision read voltage at step S823. The second hard decision read voltage according to the positive delta value Δ may be between the optimal read voltage Vopt and the first hard decision read voltage, which is smaller than the optimal read voltage Vopt.

Meanwhile, at step S823, the controller 100 may count up the value of the variable RDCNT for representation of the number of the iteration retry.

Then, the controller 100 may repeat step S810 of the hard decision ECC decoding. Step S810 may be iteratively performed up to the maximum read count until the ECC decoding of step S813 is determined to have succeeded at step S815.

When the LDPC decoding on the codeword at step S813 according to the hard decision read voltage has failed in satisfying the zero vector condition of the syndrome check at step S815, even until the iteration number of the LDPC decoding reaches the maximum read count during step S810 of the hard decision ECC decoding, the controller 100 may perform step S830 of the soft decision ECC decoding. That is, step S830 of the soft decision ECC decoding may be additionally performed when the hard decision ECC decoding of step S813 is determined to have failed at step S815 despite that step S810 of the hard decision ECC decoding is iteratively performed up to the maximum read count.

At step S831, during step S830 of the soft decision ECC decoding, the controller 100 may determine the optimal read voltage Vopt according to the hard decision read voltage corresponding to the minimum number of the USC among the numbers of the USC obtained in the course of performing the iterations the maximum read count of times during step S810 of the hard decision ECC decoding. The optimal read voltage Vopt determined at step S831 may correspond to the minimum number of the USC among the numbers of the USC obtained in the course of performing the iterations the maximum read count of times during step S810 of the hard decision ECC decoding. It is highly probable to succeed in the soft decision ECC decoding based on the soft decision data, which is generated according to a plurality of soft decision read voltages determined around the optimal read voltage Vopt.

Therefore, at step S833, the controller 100 may read the codeword from the memory cell of the memory block 211 according to the plurality of soft decision read voltages determined around the optimal read voltage Vopt determined at step S831. At step S835, the controller 100 may perform the ECC decoding on the codeword read at step S833. At step S837, the controller 100 may determine whether the ECC decoding of step S835 has succeeded.

When the ECC decoding on the codeword at step S835 according to the plurality of soft decision read voltages is determined to have failed at step S837, the data read from the memory cell of the memory block 211 may be finally determined to have failed at step S805.

FIGS. 9 to 13 are diagrams schematically illustrating a three-dimensional (3D) nonvolatile memory device in accordance with an embodiment of the present invention. FIGS. 9 to 13 illustrate the semiconductor memory device, for example, a flash memory device, implemented in 3D in accordance with an embodiment of the present invention.

Figure 9:
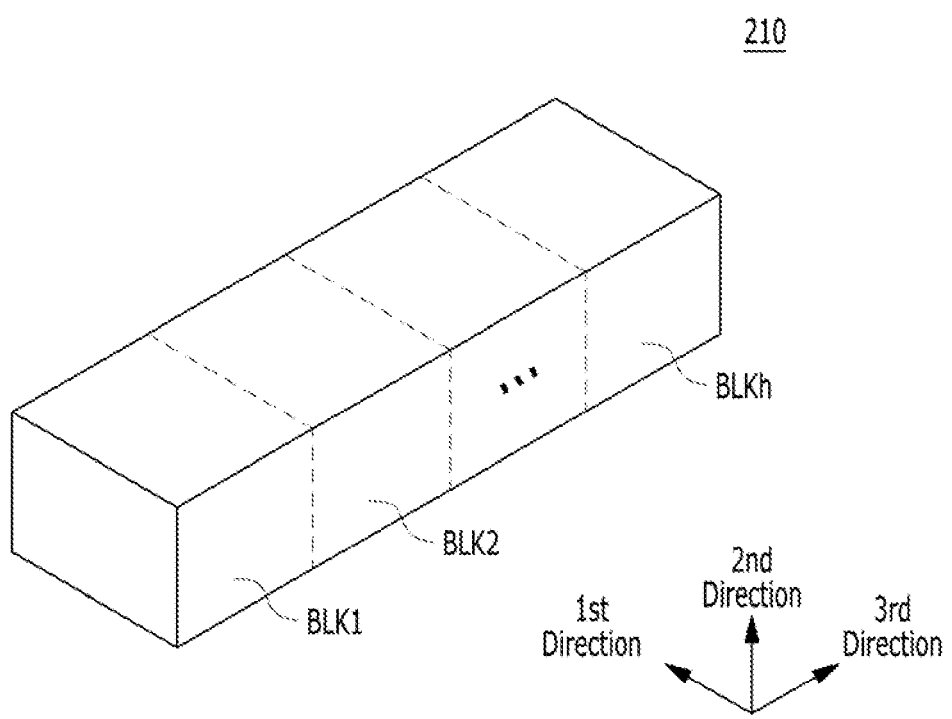
FIGS. 9 to 13 are diagrams schematically illustrating a three-dimensional (3D) nonvolatile memory device in accordance with an embodiment of the present invention.

FIG. 9 is a block diagram of the memory cell array 210 shown in FIG. 5.

Referring to FIG. 9, the memory cell array 210 may include a plurality of memory blocks BLK1 to BLKh. Each of the plural memory blocks BLK1 to BLKh may have a 3D structure or a vertical structure. For example, each of the plural memory blocks BLK1 to BLKh may include a structure extending along first to third directions.

Each of the plural memory blocks BLK1 to BLKh may include a plurality of NAND strings NS extending along the second direction. A plurality of NAND strings NS may be provided along the first and third directions. Each of the NAND strings NS may be coupled to a bit line BL, one or more string select lines SSL, one or more ground select lines GSL, a plurality of word lines WL, one or more dummy word lines DWL, and a common source line CSL. That is, each of the plural memory blocks BLK1 to BLKh may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 10:
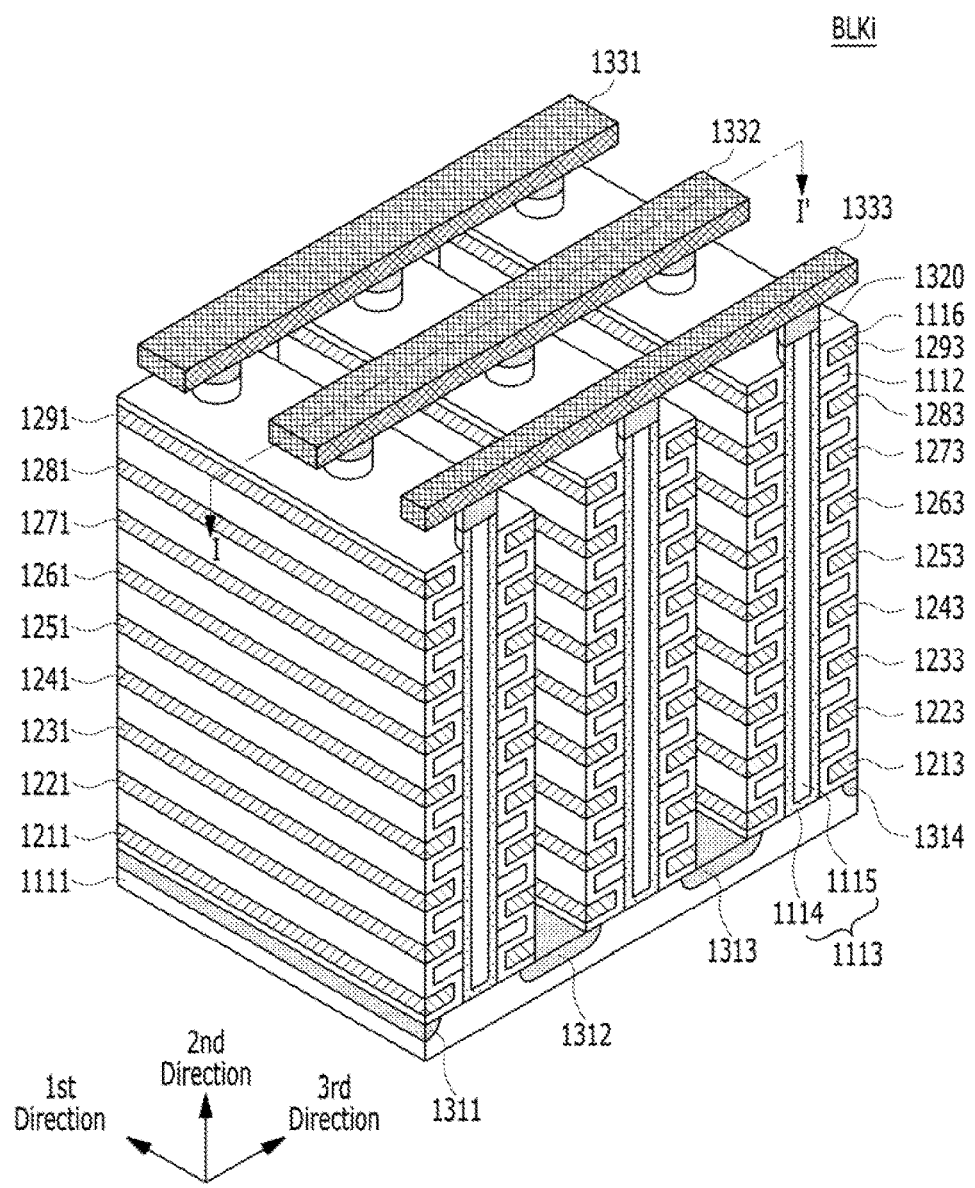
Figure 11:
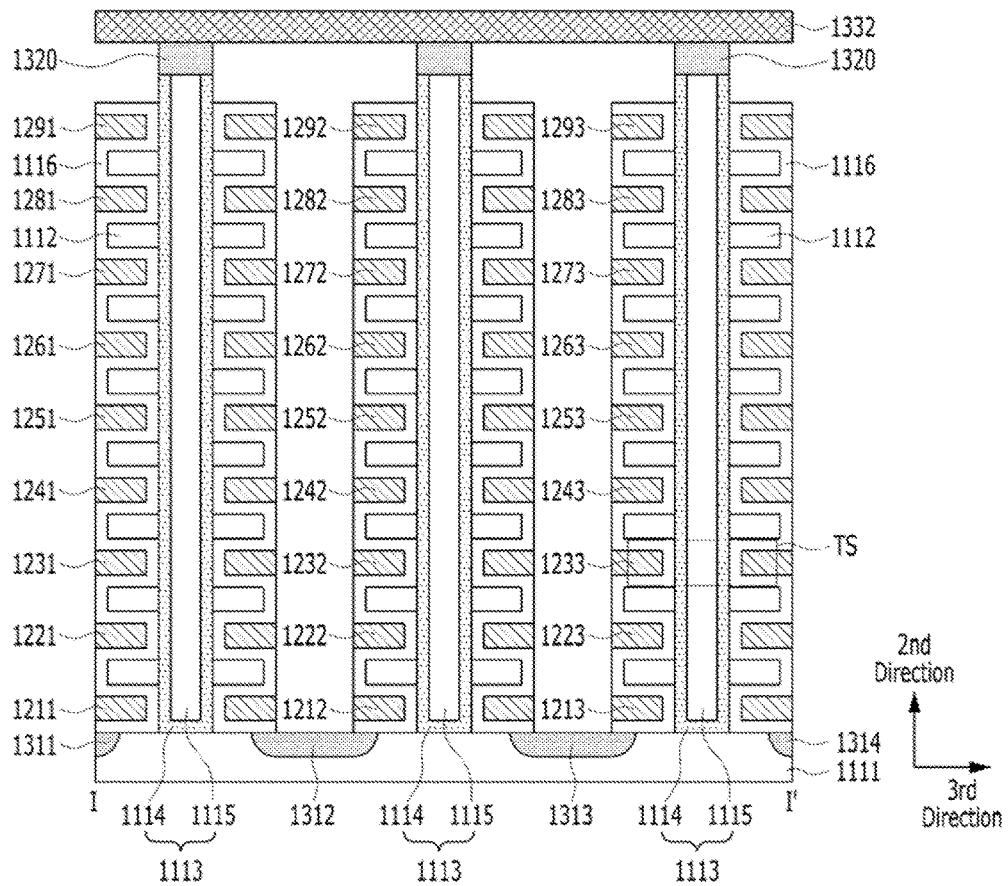

FIG. 10 is a perspective view of one memory block BLKi of the plural memory blocks BLK1 to BLKh shown in FIG. 9. FIG. 11 is a cross-sectional view taken along a line I-I' of the memory block BLKi shown in FIG. 10.

Referring to FIGS. 10 and 11, the memory block BLKi may include a structure extending along first to third directions.

A substrate 1111 may be provided. For example, the substrate 1111 may include a silicon material doped by a first type impurity. For example, the substrate 1111 may include a silicon material doped by a p-type impurity or a p-type well, e.g., a pocket p-well. The substrate 1111 may further include an n-type well surrounding the p-type well. In the description, it is exemplarily assumed that the substrate 1111 is p-type silicon. However, the substrate 1111 will not be limited to p-type silicon.

A plurality of doping regions 1311 to 1314 extending along the first direction may be provided over the substrate 1111. For example, the plurality of doping regions 1311 to 1314 may have a second type impurity differing from that of the substrate 1111. For example, the plurality of doping regions 1311 to 1314 may be doped with an n-type impurity. In the description, it is exemplarily assumed that the first to fourth doping regions 1311 to 1314 are of n-type. However, the first to fourth doping regions 1311 to 1314 will not be limited to n-type.

A plurality of insulation materials 1112 extending along the first direction may be sequentially provided along the second direction over a region of the substrate 1111 between the first and second doping regions 1311 and 1312. For example, the plurality of insulation materials 1112 and the substrate 1111 may be spaced apart by a predetermined distance in the second direction. In a second example, the plurality of insulation materials 1112 may be spaced apart from each other in the second direction. In a third example, the insulation materials 1112 may include an insulator such as silicon oxide.

A plurality of pillars 1113 may be sequentially provided along the first direction over a region of the substrate 111 between the first doping region 1311 and the second doping region 1312, and may be formed to penetrate the insulation materials 1112 along the second direction. For example, each of the plurality of pillars 1113 may penetrate the insulation materials 1112 to contact the substrate 1111. For example, each of the plural pillars 1113 may be composed of a plurality of materials. A surface layer 1114 of each of the plural pillars 1113 may include a silicon material having a first type. The surface layer 1114 of each of the plural pillars 1113 may include a silicon material doped with the same type impurity as that of the substrate 1111. In the description, it is exemplarily assumed that the surface layer 1114 of each of the pillars 1113 includes p-type silicon. However, the surface layer 1114 of each of plural pillars 1113 will not be limited to include p-type silicon.

An inner layer 1115 of each of the plural pillars 1113 may be formed of an insulation material. For example, the inner layer 1115 of each of the plural pillars 1113 may be filled with an insulation material such as silicon oxide.

In a region between the first and second doping regions 1311 and 1312, an insulation layer 1116 may be provided along exposed surfaces of the insulation materials 1112, the pillars 1113, and the substrate 1111. For example, the thickness of the insulation layer 1116 may be smaller than half of the distance between the insulation materials 1112. That is, a region in which a material other than the insulation materials 1112 and the insulation layer 1116 is disposed may be provided between (i) the insulation layer 1116 provided over the bottom surface of a first insulation material of the insulation materials 1112 and (ii) the insulation layer 1116 provided over the top surface of a second insulation material of the insulation materials 1112. The insulation materials 1112 lie below the first insulation material.

In the region between the first and second doping regions 1311 and 1312, conductive materials 1211 to 1291 may be provided over the surface of the insulation layer 1116. For example, the conductive material 1211 extending along the first direction may be provided between the substrate 1111 and the plural insulation materials 1112 adjacent to the substrate 1111. More specifically, the conductive material 1211 extending along the first direction may be provided between (i) the insulation layer 1116 disposed over the substrate 1111 and (ii) the insulation layer 1116 disposed over the bottom surface of the insulation materials 1112 adjacent to the substrate 1111.

A conductive material extending along the first direction may be provided between (i) the insulation layer 1116 disposed over the top surface of a specific insulation material among the insulation materials 1112 and (ii) the insulation layer 1116 disposed over the bottom surface of another insulation material among the insulation materials 1112, which is disposed over the specific insulation material 1112. For example, a plurality of conductive materials 1221 to 1281 extending along the first direction may be provided between the insulation materials 1112. Also, a conductive material 1291 extending along the first direction may be provided over the uppermost insulation materials 1112. For example, the conductive materials 1211 to 1291 extending along the first direction may be a metallic material. In another example, the conductive materials 1211 to 1291 extending along the first direction may be a conductive material such as polysilicon.

The same structure as the structure disposed between the first and second doping regions 1311 and 1312 may be provided between the second and third doping regions 1312 and 1313. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1212 to 1292 extending along the first direction may be provided between the second and third doping regions 1312 and 1313.

The same structure as disposed between the first and second doping regions 1311 and 1312 may be provided between the third and fourth doping regions 1313 and 1314. For example, the plurality of insulation materials 1112 extending along the first direction, the plurality of pillars 1113 which are sequentially arranged in the first direction and penetrate the plurality of insulation materials 1112 along the second direction, the insulation layer 1116 provided over the surfaces of the plurality of insulation materials 1112 and the plurality of pillars 1113, and the plurality of conductive materials 1213 to 1293 extending along the first direction may be provided between the third and fourth doping regions 1313 and 1314.

Drains 1320 may be provided over the plurality of pillars 1113, respectively. For example, the drains 1320 may be a silicon material doped with a second type material. For example, the drains 1320 may be a silicon material doped with an n-type material. In the description, it is exemplarily assumed that the drains 320 are a silicon material doped with an n-type material. However, the drains 320 are not limited to being n-type silicon materials. For example, the width of the drains 1320 may be wider than that of a corresponding one of the plural pillars 1113. For example, the drains 1320 may be provided over a top surface of the corresponding one of the plural pillars 1113, in a pad shape.

Conductive materials 1331 to 1333 extending in the third direction may be provided over the drains 1320. The conductive materials 1331 to 1333 may be sequentially disposed along the first direction. The conductive materials 1331 to 1333 may be respectively coupled to the drains 1320 in the corresponding region. For example, the drains 1320 and the conductive material 1333 extending along the third direction may be coupled to each other through contact plugs, respectively. For example, the conductive materials 1331 to 1333 extending along the third direction may be a metallic material. In another example, the conductive materials 1331 to 1333 may be a conductive material such as polysilicon.

Referring to FIGS. 10 and 11, each of the plural pillars 1113 may be coupled to the insulation layer 1116 and the plurality of conductive materials 1211 to 1291, 1212 to 1292, and 1213 to 1293 extending along the first direction, to form a string. For example, each of the plural pillars 1113 may form a NAND string NS together with the insulation layer 1116 and the conductive materials 1211 to 1291, 1212 to 1292, and 1213 to 1293 extending along the first direction. The NAND string NS may include a plurality of transistor structures TS.

Figure 12:
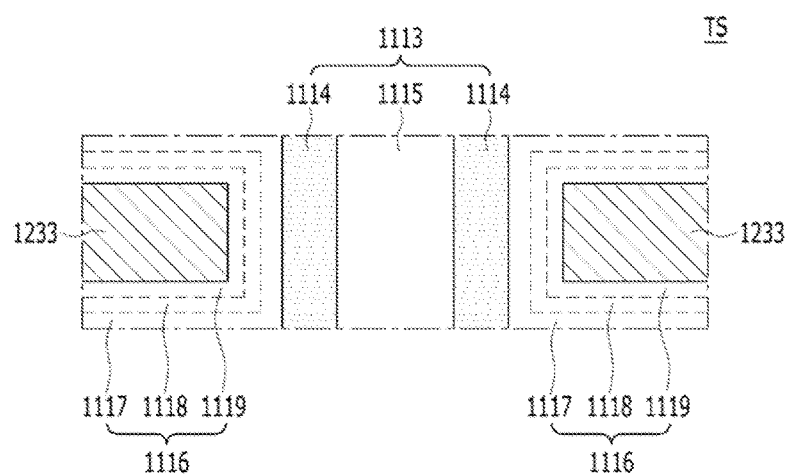

FIG. 12 is a cross-sectional view of the transistor structure TS shown in FIG. 11.

Referring to FIGS. 10 to 12, the insulation layer 1116 may include first to third sub insulation layers 1117, 1118 and 1119.

The surface layer 1114 of P-type silicon in each of the plural pillars 1113 may serve as a body. The first sub insulation layer 1117, adjacent to each of the plural pillars 1113, may serve as a tunnelling insulation layer. For example, the first sub insulation layer 1117, adjacent to the each of the plural pillars 1113, may include a thermal oxide layer.

The second sub insulation layer 1118 may serve as a charge storage layer. For example, the second sub insulation layer 1118 may serve as a charge trap layer. The second sub insulation layer 1118 may include a nitride layer or a metal oxide layer, e.g., aluminium oxide layer, hafnium oxide layer, etc.

The third sub insulation layer 1119, adjacent to a conductive material 1233, may serve as a blocking insulation layer. For example, the third sub insulation layer 1119, adjacent to the conductive material 1233 extending along the first direction, may have a mono-layered or multi-layered structure. The third sub insulation layer 1119 may be a high dielectric layer, e.g., aluminium oxide layer, hafnium oxide layer, etc., having a dielectric constant greater than the first and second sub insulation layers 1117 and 1118.

The conductive material 1233 may serve as a gate or control gate. That is, the gate or control gate 1233, the blocking insulation layer 1119, the charge trap layer 1118, the tunnelling insulation layer 1117, and the body 1114 may form a transistor or memory cell transistor structure. For example, the first to third sub insulation layers 1117 to 1119 may form an oxide-nitride-oxide (ONO) structure. In the description, the surface layer 1114 of p-type silicon in each of the plural pillars 1113 may be referred to as a body extending in the second direction.

The memory block BLKi may include the plurality of pillars 1113. That is, the memory block BLKi may include the plurality of NAND strings NS. More specifically, the memory block BLKi may include the plurality of NAND strings NS extending along the second direction or a direction perpendicular to the substrate 1111.

Each of the NAND strings NS may include the plurality of transistor structures TS, which are stacked in the second direction. One or more of the plurality of transistor structures TS of each NAND string NS may serve as a string select transistor SST. One or more of the plurality of transistor structures TS of each NAND string may serve as a ground select transistor GST.

The gates or control gates may correspond to the conductive materials 1211 to 1291, 1212 to 1292, and 1213 to 1293 extending along the first direction. That is, the gates or control gates may extend along the first direction to form word lines WL and two or more select lines, e.g., one or more string select line SSL and one or more ground select line GSL.

The conductive materials 1331 to 1333 extending along the third direction may be coupled to one end of the NAND strings NS. For example, the conductive materials 1331 to 1333 extending along the third direction may serve as bit lines BL. That is, in one memory block BLKi, a single bit line BL may be coupled to the plurality of NAND strings.

The second type doping regions 1311 to 1314 extending along the first direction may be coupled to the other end of the NAND strings NS. The second type doping regions 1311 to 1314 extending along the first direction may serve as common source lines CSL.

In summary, the memory block BLKi may include the plurality of NAND strings NS extending along a direction, e.g., a second direction, perpendicular to the substrate 1111, and may operate as a NAND flash memory block, for example, a charge trap type memory, in which the plurality of NAND strings NS is coupled to a single bit line BL.

With reference to FIGS. 10 to 12, it is described that the conductive materials 1211 to 1291, 1212 to 1292, and 1213 to 1293 extending along the first direction are provided on 9 layers. However, the first conductive materials 1211 to 1291, 1212 to 1292, and 1213 to 1293 extending along the first direction are not limited to 9 layers. For example, the conductive materials extending along the first direction may be provided upon 8, 16, or more layers. That is, a NAND string may include 8, 16, or more transistors.

With reference to FIGS. 10 to 12, it is described that 3 NAND strings NS are coupled to a single bit line BL.

However, the embodiment will not be limited to 3 NAND strings NS coupled to a single bit line BL. In another embodiment, in the memory block BLKi, m NAND strings NS may be coupled to a single bit line BL, m being an integer. Here, the number of the conductive materials 1211 to 1291, 1212 to 1292, and 1213 to 1293 extending along the first direction and the number of common source lines 1311 to 1314 may also be adjusted so as to correspond to the number of NAND strings NS coupled to a single bit line BL.

With reference to FIGS. 10 to 12, it is described that 3 NAND strings NS are coupled to a single conductive material extending along the first direction. However, the embodiment will not be limited to 3 NAND strings NS coupled to a single conductive material. In another embodiment, n NAND strings NS may be coupled to a single conductive material, n being an integer. Here, the number of the conductive materials 1331 to 1333 extending along the third direction may also be adjusted so as to correspond to the number of NAND strings NS coupled to a single conductive material.

Figure 13:
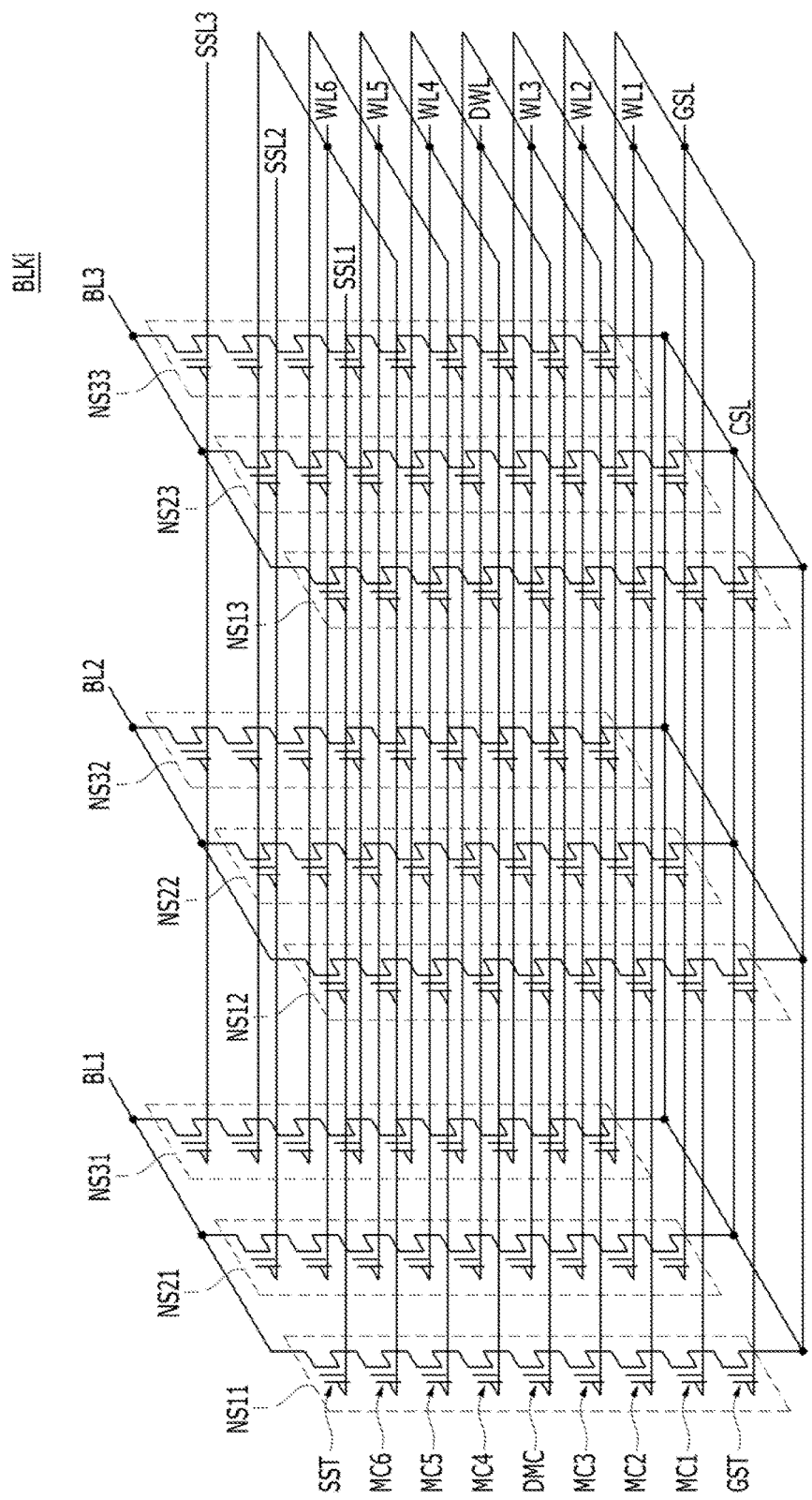

FIG. 13 is an equivalent circuit diagram illustrating the memory block BLKi described with reference to FIGS. 10 to 12.

Referring to FIGS. 10 to 13, NAND strings NS11 to NS31 may be provided between a first bit line BL1 and a common source line CSL. The first bit line BL1 may correspond to the conductive material 1331 extending along the third direction. NAND strings NS12 to NS32 may be provided between a second bit line BL2 and the common source line CSL. The second bit line BL2 may correspond to the conductive material 1332 extending along the third direction. NAND strings NS13 to NS33 may be provided between a third bit line BL3 and the common source line CSL. The third bit line BL3 may correspond to the conductive material 1333 extending along the third direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS31 coupled to the first bit line BL1 may correspond to a first column. The NAND strings NS12 to NS32 coupled to the second bit line BL2 may correspond to a second column. The NAND strings NS13 to NS33 coupled to the third bit line BL3 may correspond to a third column.

The NAND strings NS coupled to a single string select line SSL may form a single row. For example, the NAND strings NS11 to NS13 coupled to a first string select line SSL1 may form a first row. The NAND strings NS21 to NS23 coupled to a second string select line SSL2 may form a second row. The NAND strings NS31 to NS33 coupled to a third string select line SSL3 may form a third row.

A height may be defined for each NAND string NS. For example, the height of the ground select transistor GST may be defined as a value '1' in each NAND string NS. In each NAND string NS, the closer to the string selection transistor SST, the higher the height of the memory cell, when measured from the substrate 1111. In each NAND string NS, the height of the memory cell MC6 adjacent to the string select transistor SST may be defined as a value '8', which is 8 times greater than the ground select transistor GST.

The string select transistors SST of the NAND strings NS of the same row may share the same string select line SSL. The string select transistors SST of the NAND strings NS in different rows may be coupled with different string select lines SSL1, SSL2, and SSL3, respectively.

The memory cells MC having the same height in the NAND strings NS of the same row may share a word line WL. At a predetermined height, the word line WL may be shared by the memory cells MC of the NAND strings NS in different rows but in the same level or at the same height. At a predetermined height or at the same level, dummy memory cells DMC of the NAND strings NS of the same row may share a dummy word line DWL. At a predetermined height or level, the dummy memory cells DMC of the NAND strings NS in different rows may share the dummy word lines DWL.

For example, the word lines WL or the dummy word lines DWL located at the same level or height or layer may be commonly coupled on layers where the conductive materials 1211 to 1291, 1212 to 1292, and 1213 to 1293 extending in the first direction are provided. For example, the conductive materials 1211 to 1291, 1212 to 1292, and 1213 to 1293 provided at a given level or height or layer may be coupled to an upper layer via a contact. The conductive materials 1211 to 1291, 1212 to 1292, and 1213 to 1293 extending in the first direction may be coupled in common at the upper layer. The ground select transistors GST of the NAND strings NS of the same row may share the ground select line GSL. The ground select transistors GST of the NAND strings NS in different rows may share the ground select line GSL. That is, the NAND strings NS11 to NS13, NS21 to NS23, and NS31 to NS33 may be coupled in common to the ground select line GSL.

The common source line CSL may be commonly coupled to the NAND strings NS. For example, the first to fourth doping regions 1311 to 1314 may be coupled at an active region of the substrate 1111. For example, the first to fourth doping regions 1311 to 1314 may be coupled to an upper layer via a contact. The first to fourth doping regions 1311 to 1314 may be coupled in common at the upper layer.

As illustrated in FIG. 13, the word lines WL at the same height or level may be commonly coupled. Therefore, when a word line WL at a specific height is selected, all of the NAND strings NS coupled to the selected word line WL may be selected. The NAND strings NS in different rows may be coupled to different string select lines SSL. Accordingly, among the NAND strings NS coupled to the same word line WL, the NAND strings NS of the unselected row may be electrically isolated from the bit lines BL1 to BL3 according to selection of the string selection lines SSL1 to SSL3. That is, a row of the NAND strings NS may be selected by selecting one of the string select lines SSL1 to SSL3. The NAND strings NS of the selected row may be selected in units of columns according to selection of the bit lines BL1 to BL3.

In each NAND string NS, a dummy memory cell DMC may be provided. In FIG. 13, the dummy memory cell DMC is provided between the third memory cell MC3 and the fourth memory cell MC4 in each NAND string NS. That is, the first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. In the embodiment, it is exemplarily assumed that the memory cells MC in each NAND string NS are divided into memory cell groups by the dummy memory cell DMC. A memory cell group, e.g., MC1 to MC3, that is adjacent to the ground select transistor GST among the memory cell groups may be referred to as a lower memory cell group. A memory cell group, e.g., MC4 to MC6, adjacent to the string select transistor SST among the memory cell groups may be referred to as an upper memory cell group.

An operating method of a nonvolatile memory device which includes one or more cell strings each arranged in a direction perpendicular to a substrate coupled with a memory controller and including memory cells, a string select transistor, and a ground select transistor will be described with reference to FIGS. 9 to 13. With the operating method, the nonvolatile memory device: may be provided with a first read command to perform first and second hard decision read operations according to a first hard decision read voltage and a second hard decision read voltage, which is different from the first hard decision read voltage; may acquire hard decision data; may select one of the first and second hard decision voltages based on an error bit state of the hard decision data; may acquire soft decision data according to a soft read voltage, which is different from the first and second hard decision read voltages; and may provide the soft decision data to a memory controller.

Figure 14:
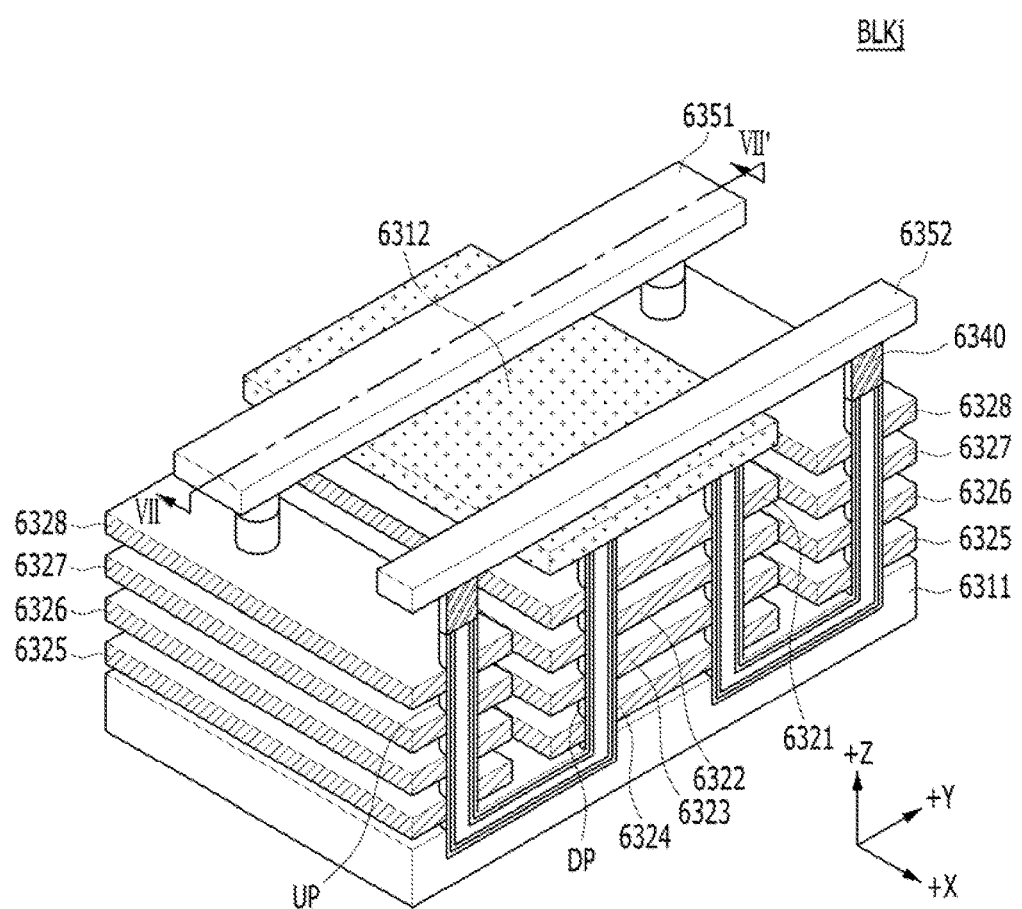
FIGS. 14 to 16 are diagrams schematically illustrating a 3D nonvolatile memory device in accordance with an embodiment of the present invention.
Figure 15:
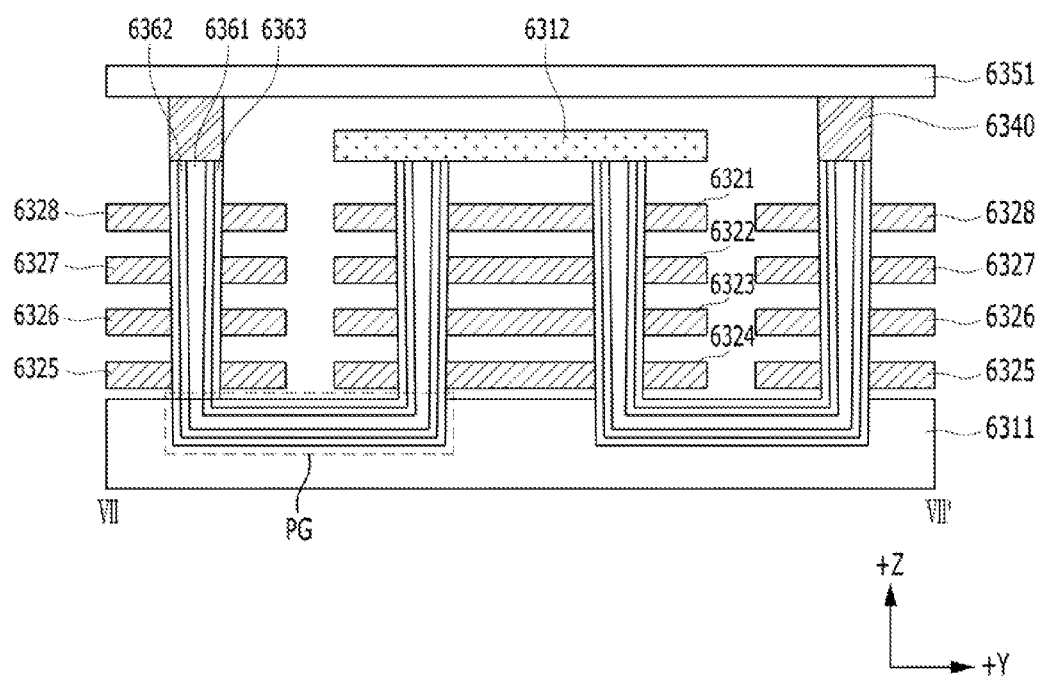
Figure 16:
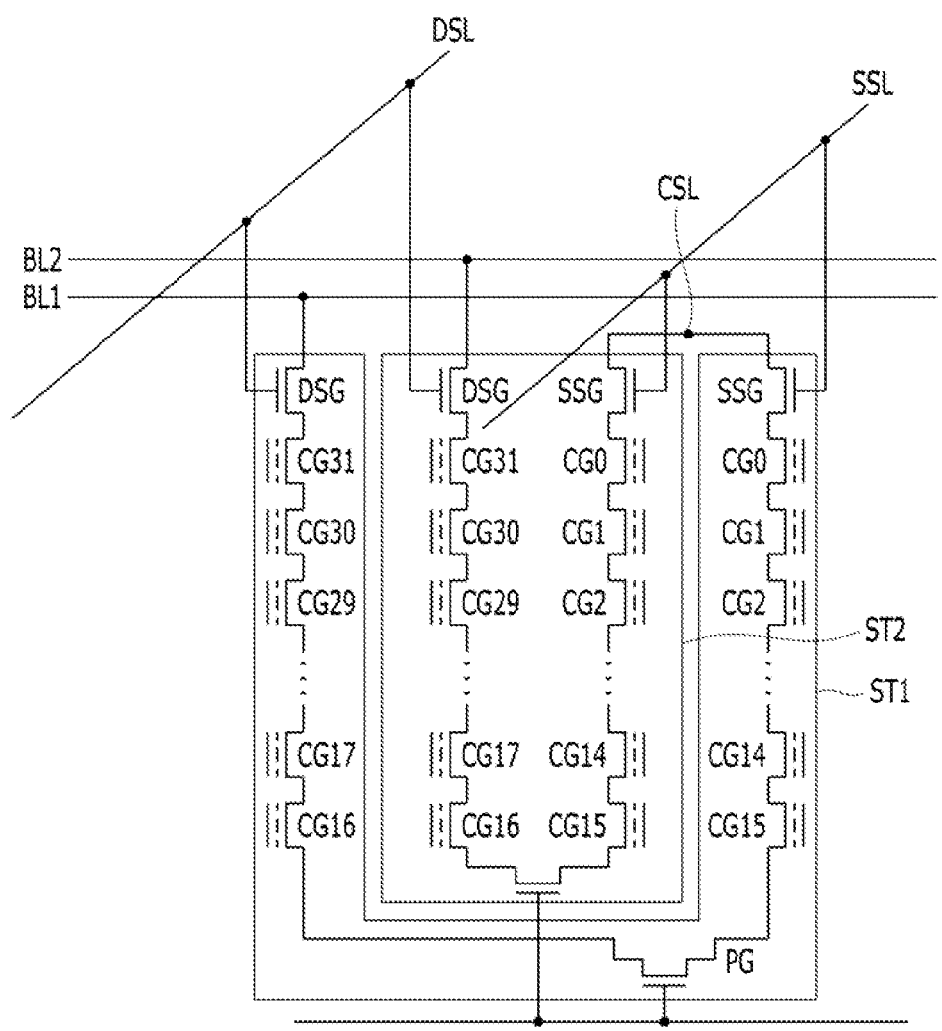

FIGS. 14 to 16 are diagrams schematically illustrating a 3D nonvolatile memory device in accordance with an embodiment of the present invention. FIGS. 14 to 16 illustrate the semiconductor memory device, for example a flash memory device implemented in 3D in accordance with an embodiment of the present invention.

FIG. 14 is a perspective view illustrating one memory block BLKj of the memory blocks 211 shown in FIG. 5. FIG. 15 is a sectional view illustrating the memory block BLKj taken along the line VII-VII' shown in FIG. 14.

Referring to FIGS. 14 and 15, the memory block BLKj may include a structure extending along first to third directions.

A substrate 6311 may be provided. For example, the substrate 6311 may include a silicon material doped by a first type impurity. For example, the substrate 6311 may include a silicon material doped by a p-type impurity or a p-type well, e.g., a pocket p-well. The substrate 6311 may further include an n-type well surrounding the p-type well. In the embodiment, it is exemplarily assumed that the substrate 6311 is p-type silicon. However, the substrate 6311 will not be limited to the p-type silicon.

First to a fourth conductive material layers 6321 to 6324 extending along the X-direction and the Y-direction may be disposed over the substrate 6311. The first to fourth conductive material layers 6321 to 6324 may be spaced from one another in the Z-direction.

Fifth to eighth conductive material layers 6325 to 6328 extending along the X-direction and the Y-direction may be disposed over the substrate 6311. The fifth to eighth conductive material layers 6325 to 6328 may be spaced from one another in the Z-direction. The fifth to eighth conductive material layers 6325 to 6328 may be spaced from the first to fourth conductive material layers 6321 to 6324 in the Y-direction.

A plurality of lower pillars DP may be formed to penetrate the first to fourth conductive material layers 6321 to 6324. Each of the plural lower pillars DP may be extended in the Z-direction. A plurality of upper pillars UP may be formed to penetrate the fifth to eighth conductive material layers 6325 to 6328. Each of the plural upper pillars UP may be extended in the Z-direction.

Each of the lower pillars DP and the upper pillars UP may include an internal material layer 6361, a middle layer 6362 and a surface layer 6363. The middle layer 6362 may serve as a channel of the cell transistor. The surface layer 6363 may include a blocking insulating layer, an electric charge storage layer, and a tunnel insulating layer.

The plural lower pillars DP and the plural upper pillars UP may be coupled through a pipe gate PG. The pipe gate PG may be formed in the substrate 6311. For example, the pipe gate PG may include substantially the same material as the plural lower pillars DP and the plural upper pillars UP.

A doping material layer 6312 doped with a second type impurity may be disposed over the plural lower pillars DP. The doping material layer 6312 may extend in the X direction and the Y direction. For example, the doping material layer 6312 doped with the second type impurity may include an n-type silicon material. The doping material layer 6312 doped with the second type impurity may serve as the common source line CSL.

Drains 6340 may be formed over each of the plural upper pillars UP. For example, the drain 6340 may include an n-type silicon material. First and second upper conductive material layers 6351 and 6352 may be formed over the drains 6340. The first and second upper conductive material layers 6351 and 6352 may be extended in the Y-direction.

The first and second upper conductive material layers 6351 and 6352 may be spaced apart from each other in the X-direction. For example, the first and second upper conductive material layers 6351 and 6352 may be made of metal. For example, the first and second upper conductive material layers 6351 and 6352 may be coupled to the drains 6340 through contact plugs. The first and second upper conductive material layers 6351 and 6352 may serve as first and second bit lines BL1 and BL2, respectively.

The first conductive material layer 6321 may serve as the source select line SSL, and the second conductive material layer 6322 may serve as the first dummy word line DWL1, and the third and fourth conductive material layers 6323 and 6324 may serve as the first and second main word lines MWL1 and MWL2, respectively. The fifth and sixth conductive material layers 6325 and 6326 may serve respectively as the third and fourth main word lines MWL3 and MWL4, the seventh conductive material layer 6327 may serve as the second dummy word line DWL2, and the eighth conductive material layer 6328 may serve as the drain select line DSL.

Each of the plural lower pillars DP and the first to fourth conductive material layers 6321 to 6324 adjacent to the lower pillar DP may form a lower string. Each of the plural upper pillars UP and the fifth to eighth conductive material layers 6325 to 6328 adjacent to the upper pillar UP may form an upper string. The lower string and the upper string may be coupled through the pipe gate PG. One end of the lower string may be coupled to the second-type doping material layer 6312 serving as the common source line CSL. One end of the upper string may be coupled to a corresponding bit line through the drain 6340. The lower string and the upper string are coupled through the pipe gate PG. A single lower string and a single upper string may form a single cell string coupled between the second-type doping material layer 6312 serving as the common source line CSL and a corresponding one of the upper conductive material layers 6351 and 6352 serving as the bit line BL.

That is, the lower string may include the source select transistor SST, the first dummy memory cell DMC1, and the first and second main memory cells MMC1 and MMC2. The upper string may include the third and fourth main memory cells MMC3 and MMC4, the second dummy memory cell DMC2 and the drain select transistor DST.

Referring to FIGS. 14 and 15, the upper string and the lower string may form the NAND string NS having a plurality of transistor structures TS. The transistor structure TS may be substantially the same as the transistors described with reference to FIG. 12.

FIG. 16 is an equivalent circuit diagram illustrating the memory block BLKj described with reference to FIGS. 14 and 15. FIG. 16 exemplarily shows first and second strings among the strings included in the memory block BLKj.

Referring to FIG. 16, the memory block BLKj may include a plurality of cell strings, each of which comprises a single upper string and a single lower string coupled to each other through the pipe gate PG, as described with reference to FIGS. 14 and 15.

In the memory block BLKj, memory cells CG0 to CG31 stacked along a first channel layer CH1 (not shown), one or more source selection gates SSG, and one or more drain selection gates DSG may form a first string ST1. Memory cells CG0 to CG31 stacked along a second channel layer CH2 (not shown), one or more source selection gates SSG, and one or more drain selection gates DSG may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 16 shows the first and second strings ST1 and ST2 coupled to a single drain selection line DSL and a single source selection line SSL. In another embodiment, the first and second strings ST1 and ST2 may be coupled to a single source selection line SSL and a single bit line BL. In such case, the first string ST1 may be coupled to the first drain selection line DSL1, and the second string ST2 may be coupled to the second drain selection line DSL2. In another embodiment, the first and second strings ST1 and ST2 may be coupled to a single drain selection line DSL and a single bit line BL. In such case, the first string ST1 may be coupled to the first source selection line SSL1, and the second string ST2 may be coupled to the second source selection line SSL2.

Figure 17:
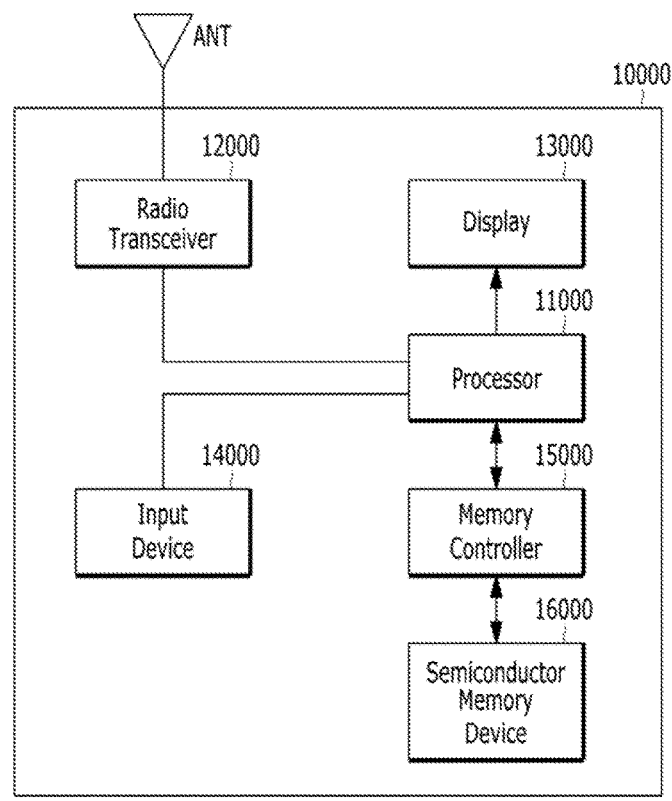
FIG. 17 is a block diagram schematically illustrating an electronic device including a semiconductor memory system in accordance with an embodiment of the present invention.

FIG. 17 is a block diagram schematically illustrating an electronic device 10000 including a memory controller 15000 and a semiconductor memory device 16000 in accordance with an embodiment of the present invention.

Referring to FIG. 17, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 13. The semiconductor memory device 16000 may store random data.

The memory controller 15000 may correspond to the memory controller described with reference to FIGS. 3 to 13. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 18:
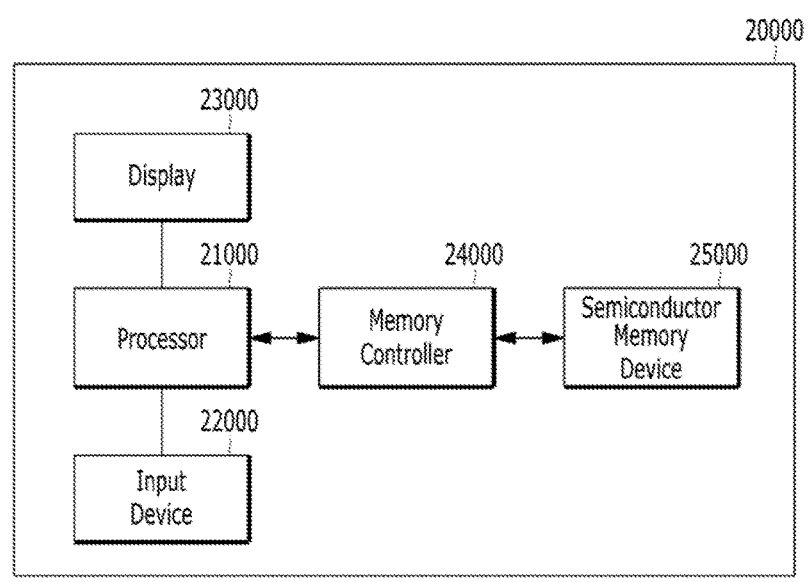
FIG. 18 is a block diagram schematically illustrating an electronic device including a semiconductor memory system in accordance with an embodiment of the present invention.

FIG. 18 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 13, respectively.

Referring to FIG. 18, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., the flash memory device, and the memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 19:
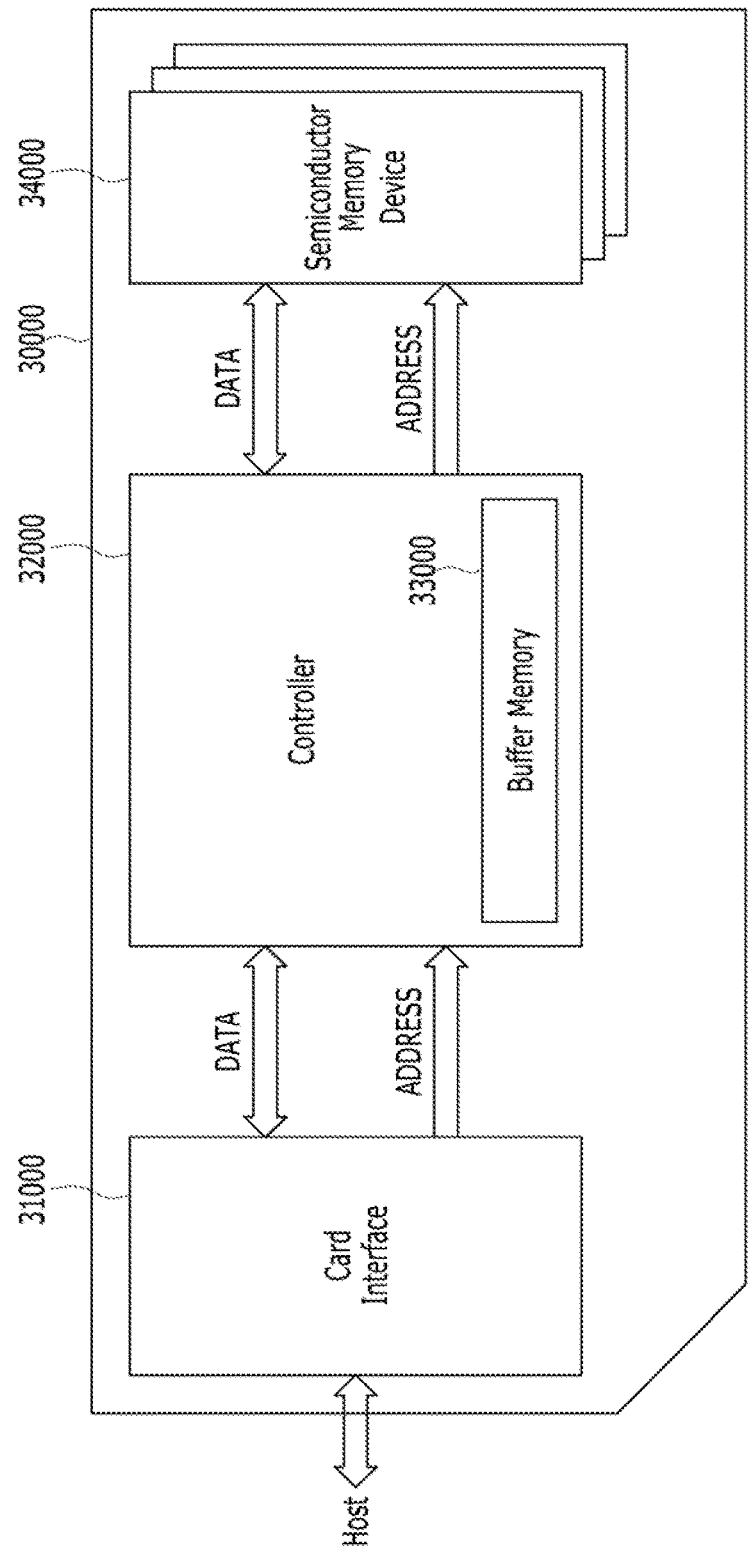
FIG. 19 is a block diagram schematically illustrating an electronic device including a semiconductor memory system in accordance with an embodiment of the present invention.

FIG. 19 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 13, respectively.

Referring to FIG. 19, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which will not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 20:
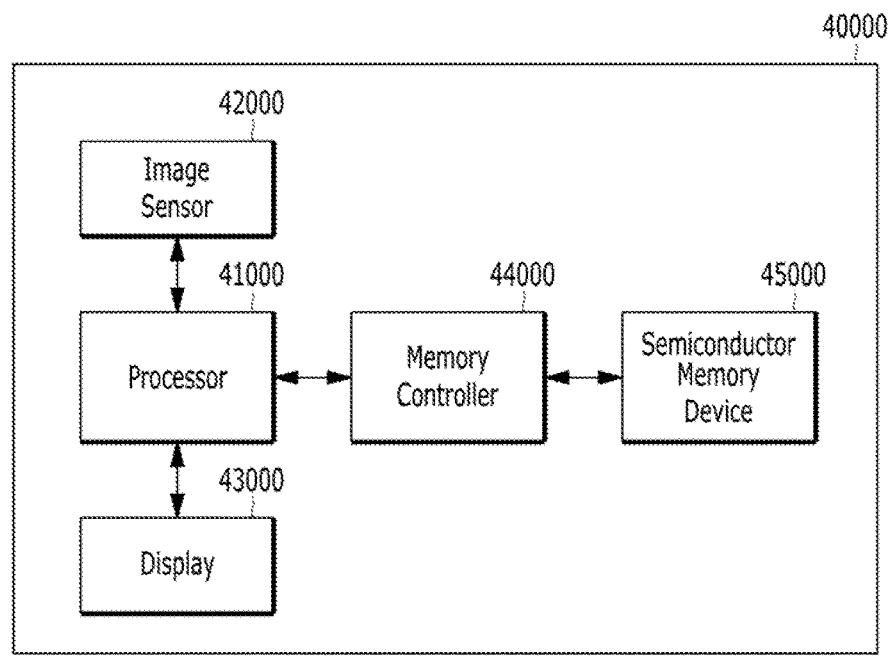
FIG. 20 is a block diagram schematically illustrating an electronic device including a semiconductor memory system in accordance with an embodiment of the present invention.

FIG. 20 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 13, respectively.

Referring to FIG. 20, the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 21:
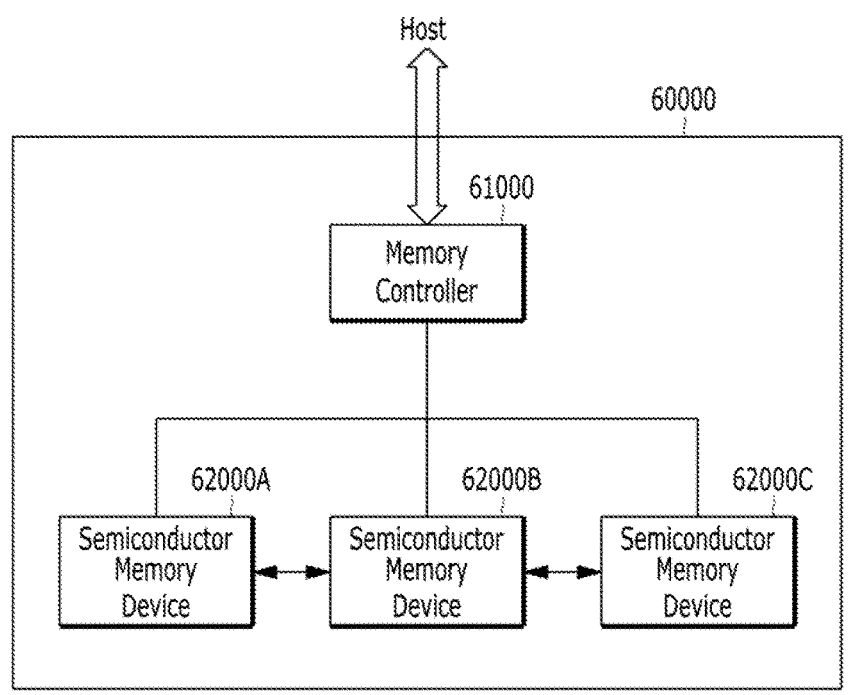
FIG. 21 is a block diagram schematically illustrating an electronic device including a semiconductor memory system in accordance with an embodiment of the present invention.

FIG. 21 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 13, respectively.

Referring to FIG. 21, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the plural semiconductor memory devices 62000A, 62000B, and 62000C.

The electronic device 60000 may be implemented by a memory system or a memory module.

For example, the memory controller 61000 may be implemented outside or inside the electronic device 60000.

Figure 22:
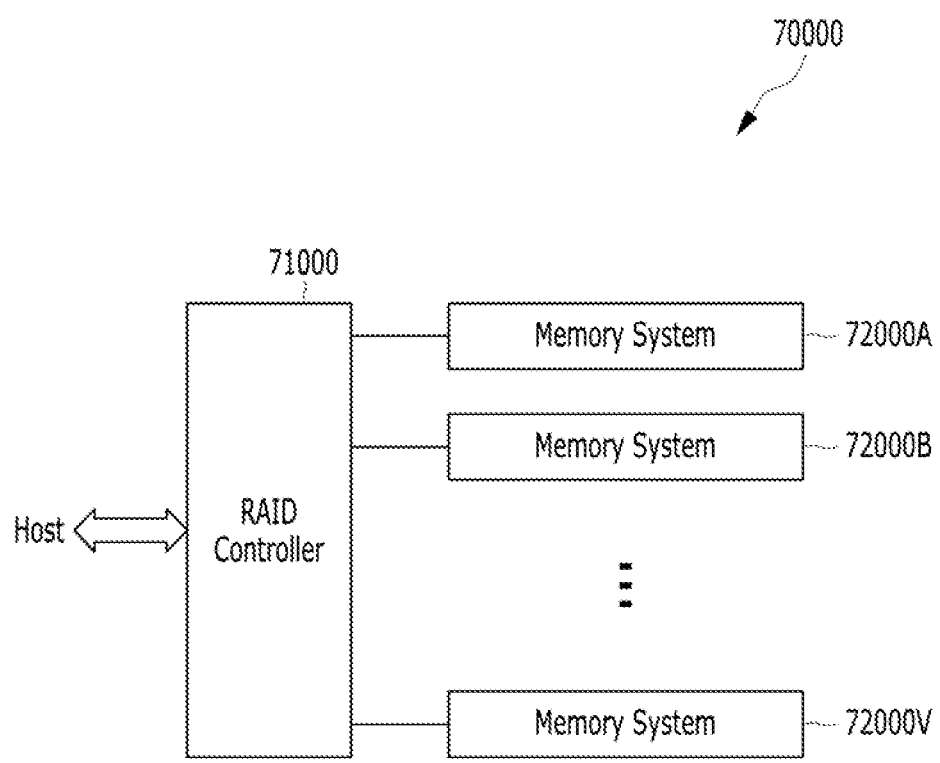
FIG. 22 is a block diagram of a data processing system including an electronic device shown in FIG. 21.

FIG. 22 is a block diagram of a data processing system including the electronic device 6000 described with reference to FIG. 21.

Referring to FIGS. 21 and 22, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 21. The memory systems 72000A to 72000N may form a RAID array. The data storage device 70000 may be implemented by an SSD.

During a program operation, the RAID controller 71000 may output program data, which is output from a host, to one of the memory systems 72000A to 72000N according to one selected from a plurality of RAID levels based on RAID level information output from the host.

During a read operation, the RAID controller 71000 may transfer data, which is read from one of the memory systems 72000A to 72000N, to the host according to one selected from the plurality of RAID levels based on the RAID level information output from the host.

While the present invention has been described with respect to the specific embodiments, it will be apparent to those skilled in the art that various changes and modifications may be made without departing from the spirit and scope of the invention as defined in the following claims.

What is claimed is:

1. An operating method of a controller, comprising:
   iterating a first ECC decoding on a codeword read from a semiconductor memory device by generating hard decision data according to a hard decision read voltage by a predetermined iteration number until the first ECC decoding succeeds, wherein a value of the hard decision read voltage is updated on basis of a number of an unsatisfied syndrome check (USC); and
   when the first ECC decoding fails until the predetermined iteration number, performing a second ECC decoding on the codeword by generating soft decision data according to the hard decision read voltage, a value of which corresponds to the minimum number of the USC among the updated values during the iterating of the first ECC decoding.

2. The operating method of the controller of claim 1, wherein the first ECC decoding is a low density parity check (LDPC) decoding.

3. The operating method of the controller of claim 2, wherein the USC is a nonzero element of a vector generated by a syndrome check of the LDPC decoding.

4. An operating method of a controller, comprising:
   a first step of performing a first ECC decoding on a codeword read from a semiconductor memory device by generating hard decision data according to a hard decision read voltage;
   a second step of determining the first ECC decoding to have failed or succeeded based on an unsatisfied syndrome check (USC) included in a result of the first ECC decoding;
   a third step of updating a value of the hard decision read voltage based on a number of the USC when the first ECC decoding is determined to have failed; and
   a fourth step of iterating the first to third steps by a predetermined iteration number until the first ECC decoding succeeds.

5. The operating method of the controller of claim 4, further comprising:

a fifth step of performing a second ECC decoding on the codeword by generating soft decision data according to the hard decision read voltage, a value of which corresponds to the minimum number of the USC among the updated values during the fourth step, when the first ECC decoding fails until the predetermined iteration number.

6. The operating method of the controller of claim 4, wherein the first ECC decoding is a low density parity check (LDPC) decoding.

7. A controller comprising:
an ECC unit detecting and correcting an error included in data read from a semiconductor memory device,
wherein the ECC unit:
iterates a first ECC decoding on a codeword read from a semiconductor memory device by generating hard decision data according to a hard decision read voltage by a predetermined iteration number until the first ECC decoding succeeds, wherein a value of the hard decision read voltage is updated on basis of a number of an unsatisfied syndrome check (USC); and
performs a second ECC decoding on the codeword by generating soft decision data according to the hard decision read voltage, a value of which corresponds to the minimum number of the USC among the updated values during the iteration of the first ECC decoding, when the first ECC decoding fails until the predetermined iteration number.

8. The controller of claim 7, wherein the first ECC decoding is a low density parity check (LDPC) decoding.

9. The controller of claim 8, wherein the USC is a nonzero element of a vector generated by a syndrome check of the LDPC decoding.

10. A controller comprising:
an ECC unit detecting and correcting an error included in data read from a semiconductor memory device,
wherein the ECC unit:
(1) performs a first ECC decoding on a codeword read from a semiconductor memory device by generating hard decision data according to a hard decision read voltage;
(2) determines the first ECC decoding to have failed or succeeded on the basis of an unsatisfied syndrome check (USC) included in a result of the first ECC decoding; and
(3) updates a value of the hard decision read voltage based on a number of the USC when the first ECC decoding is determined to have failed,
(4) iterates the operations of (1) to (3) by a predetermined iteration number until the first ECC decoding succeeds.

11. The controller of claim 10,
wherein the ECC unit performs a second ECC decoding on the codeword by generating soft decision data according to the hard decision read voltage, a value of which corresponds to the minimum number of the USC among the updated values during the iterating of the operations of the first to third means, when the first ECC decoding fails until the predetermined iteration number.

12. The controller of claim 10, wherein the first ECC decoding is a low density parity check (LDPC) decoding.

13. A semiconductor memory system comprising:
a semiconductor memory device; and
a controller,
wherein the controller:
iterates a first ECC decoding on a codeword read from a semiconductor memory device by generating hard decision data according to a hard decision read voltage by a predetermined iteration number until the first ECC decoding succeeds, wherein a value of the hard decision read voltage is updated on basis of a number of an unsatisfied syndrome check (USC); and
performs a second ECC decoding on the codeword by generating soft decision data according to the hard decision read voltage, a value of which corresponds to the minimum number of the USC among the updated values during the iterating of the first ECC decoding, when the first ECC decoding fails until the predetermined iteration number.

14. The semiconductor memory system of claim 13, wherein the first ECC decoding is a low density parity check (LDPC) decoding.

15. The semiconductor memory system of claim 14, wherein the USC is a nonzero element of a vector generated by a syndrome check of the LDPC decoding.

16. A semiconductor memory system comprising:
a semiconductor memory device; and
a controller,
wherein the controller:
(1) performs a first ECC decoding on a codeword read from a semiconductor memory device by generating hard decision data according to a hard decision read voltage;
(2) determines the first ECC decoding to have failed or succeeded on the basis of an unsatisfied syndrome check (USC) included in a result of the first ECC decoding;
(3) updates a value of the hard decision read voltage based on a number of the USC when the first ECC decoding is determined to have failed, and
(4) iterates the operations of (1) to (3) by a predetermined iteration number until the first ECC decoding succeeds.

17. The semiconductor memory system of claim 16, wherein the controller performs a second ECC decoding on the codeword by generating soft decision data according to the hard decision read voltage, a value of which corresponds to the minimum number of the USC among the updated values during the iterating of the operations of (1) to (3), when the first ECC decoding fails until the predetermined iteration number.

18. The semiconductor memory system of claim 16, wherein the first ECC decoding is a low density parity check (LDPC) decoding.

* * * * *